(12) United States Patent
Shigeno

(10) Patent No.: US 7,115,913 B2
(45) Date of Patent: Oct. 3, 2006

(54) ARRAY SUBSTRATE USED FOR A DISPLAY DEVICE AND A METHOD OF MAKING THE SAME

(75) Inventor: Hirotaka Shigeno, Hyogo-ken (JP)

(73) Assignee: TFPD Corporation, Himeji (JP)

( * ) Notice: Subject to any disclaimer, the term of this patent is extended or adjusted under 35 U.S.C. 154(b) by 678 days.

(21) Appl. No.: 10/395,100

(22) Filed: Mar. 25, 2003

(65) Prior Publication Data

US 2003/0209726 A1 Nov. 13, 2003

(30) Foreign Application Priority Data

Mar. 27, 2002 (JP) ........................................ 2002-089731
Mar. 27, 2002 (JP) ........................................ 2002-089732

(51) Int. Cl.
*H01L 21/00* (2006.01)
*H01L 29/205* (2006.01)

(52) U.S. Cl. ........................................ 257/91; 438/39

(58) Field of Classification Search .................. 438/22, 438/39; 257/99, 98, 91, 88, 79, 59
See application file for complete search history.

(56) References Cited

U.S. PATENT DOCUMENTS 6,351,010 B1 * 2/2002 Yamanaka et al. .......... 257/350

* cited by examiner

*Primary Examiner*—Wael Fahmy
*Assistant Examiner*—Monica D. Harrison
(74) *Attorney, Agent, or Firm*—Oblon, Spivak, McClelland, Maier & Neustadt, P.C.

(57) ABSTRACT

A TFT array substrate used for a display device and a method of making the same are disclosed. A optically transparent thick resin insulation film 5 is formed on a base substrate and an upper contact hole 51 is perforated through the optically transparent thick resin insulation film 5. A lower contact hole 41 perforated through a gate insulation film 15 and patterning of an ITO film to make a transparent pixel electrode are then collectively carried out under a photoresist pattern 8. Where the photoresist pattern 8 is provided after making the ITO film, an aperture 81 is perforated closer to the center of the upper contact hole 51 at an end portion of a connecting line 14a for a pad and is smaller in diameter by a side etching size plus a margin than the upper contact hole. Subsequently, following three-etching steps are carried out: (1) patterning of the ITO film along the photoresist pattern 8, (2) the lower contact hole 41 is made by using buffered hydrofluoric acid solution, and (3) an "eaves" portion 6a of the ITO films is removed.

16 Claims, 34 Drawing Sheets

ARRAY SUBSTRATE USED FOR A DISPLAY DEVICE AND A METHOD OF MAKING THE SAME

FIELD OF THE INVENTION

This invention generally relates to a display device and a method of making the same and, more particularly, to a thick resin coated array substrate suitable for a liquid crystal display device, and a method of making the same.

BACKGROUND OF THE INVENTION

Recently, flat panel display devices, such as liquid crystal display devices, have been well developed as substitute components for cathode ray tubes. Such liquid crystal display devices have significant advantages, e.g., light weight, thin thickness, low power consumption, etc. Their mainstream products are active matrix type liquid crystal devices because their display images have substantially no cross-talk between neighboring pixels due to thin film transistor switching elements connected to pixel electrodes. Thus, by way of example, such active matrix type liquid crystal display ("AMLCD") devices are explained below in detail.

The AMLCD device includes a thin film transistor ("TFT") array substrate, a counter substrate provided opposite to the TFT array substrate, alignment layers coated on opposing surfaces of the TFT array and counter substrates, and a liquid crystal layer held between the alignment layers. The TFT array substrate is provided with a transparent insulation substrate, signal and scanning lines, pixel electrodes, and thin film transistors. The insulation substrate is made of glass, quartz, or the like. The signal and scanning lines are disposed in a matrix form and are isolated through an insulation layer. The pixel electrodes are provided at pixels and are made of transparent materials, e.g., indium-tin-oxide ("ITO") films, etc. The thin film transistors are disposed in the vicinities of intersection points of the matrix to carry out switching functions, so that the transistors electrically isolate turning-on pixels from turning-off ones and hold video signals supplied to the turning-on pixels. The gate and drain electrodes of the transistors are connected to the scanning and signal lines, respectively, while source electrodes of the transistors are coupled to pixel electrodes.

The counter substrate, on the other hand, includes a transparent insulation substrate also made of glass material or the like and an ITO counter electrode formed on the insulation substrate.

The AMLCD has a display region and a non-display region around the display region to define an electrically connecting portion. The non-display region projects from the display region to form a shelf-like connecting plate where connecting pads and terminals are disposed to receive input signals from external driving devices. A liquid crystal layer is held between the TFT array and counter substrates. Fringes of the TFT array and counter substrates are sealed by sealant materials.

The production cost of the AMLCD device depends highly on that of the TFT array substrate because a lot of production processing steps are necessary to manufacture the TFT array substrate. Thus, the former is a key factor to reduce the total production cost of an AMLCD device or the like.

In that connection, Japanese Patent Disclosure Tokkaihei 9-160076 proposes the following method of manufacturing a TFT array substrate: (1) signal lines, source and drain electrodes, semiconductor layers, etc., have been processed together by a same mask pattern, (2) contact holes to connect source electrodes to pixel electrodes and outer peripheral contact holes to expose connecting terminals for signal and scanning lines are perforated at the same time, and (3) pixel electrodes are formed on the top layer of the TFT substrate. Such a method can improve productivity because the number of mask patterns decreases with the yield rate substantially unchanged. Where the connecting terminals for the scanning lines, etc., however, are exposed, it is necessary to perforate holes in both interlayer and gate insulation films. Thus, a wet etching process of buffered hydrofluoric acid ("BHF") etc. is carried out to perforate the interlayer and gate insulation films made of silicon oxide and silicon nitride, respectively, at the same time (disclosed in Japanese Patent Disclosure Tokkai 2000-267595).

The TFT array substrate of this sort, on the other hand, requires a greater aperture ratio of pixels to make the efficiency of light from a rear light source improved. Reflection type flat panel display devices, however, require an effective reflection ratio of the ambient light by increasing an area ratio of the pixel electrodes.

Recently, in order to improve the pixel aperture and reflection ratios, the pixel electrodes are formed over wiring patterns, and the thin film transistors on the TFT array substrate and a thick resin insulation film are disposed between the pixel electrodes and wiring patterns. The thin film transistors and the signal and scanning lines are disposed, also through the thick resin insulation film, at peripheral portions of the pixel electrodes. The thick resin insulation film is generally 1 μm to 10 μm and, typically, 2 μm to 4 μm in thickness and is made of a low dielectric constant organic material, so that substantially no electronic capacitor or short circuit may take place between the pixel electrodes, the signal lines, or the like.

Further, light shielding films have been integrated on the TFT array or counter substrate to cover the thin film transistors, gaps between peripheral portions of the pixel electrodes and the signal lines and those between the peripheral portions of the pixel electrodes and the scanning lines. That is to avoid undesirable electronic capacitors or short circuits due to overlaps of the pixel electrodes with the signal or scanning lines, and also to adjust discrepancies between patterns of the pixel electrodes and those of the signal or scanning lines to sufficiently prevent light from leaking between the above-stated gaps.

The thick resin insulation film resolves losses of the pixel apertures resulting from alignment margins so that the aperture ratios are improved and larger. A TFT array substrate used for reflection type liquid crystal display devices includes reflection type pixel electrodes made of aluminum or the like and formed on the top of a TFT array pattern, and a thick resin insulation film disposed between the pixel electrodes and lower wiring layers. A resulting resin layer makes peripheral portions of the reflection type pixel electrodes possible to cover scanning and signal lines and thin film transistors. As a result, since the pixel electrodes become bigger in area, the light utilization efficiency is improved. Further, the thick resin layer prevents parasitic capacitors from increasing their electric capacities. Furthermore, it is configured to make both surface of the pixel electrode and liquid crystal layer thickness uniform.

Recently, as display performances required for compact information terminals or mobile phones become improved, transflective or hybrid (transparent and reflection) type display devices have been in use. It includes pixel electrodes made of an optically transparent and electrically conductive film (e.g., ITO film), and optical reflection type electrodes. Under lighted environment, such as sun light, the optical reflection type electrodes (reflection type pixel electrode portions) primarily perform a display function by reflection of incident ambient light but under dark environment the optically transparent and electrically conductive film carries out another display function by a rear light source.

Such transflective type display devices need the pixel electrodes consisting of two kinds of electrically conductive films formed by different patterning processes. Thus, it is necessary to carry out additionally at least one patterning process called a photo engraving process ("PEP") in comparison with reflection and not transflective type display devices, i.e., the steps of preparing a series of additional mask patterns, photoresist resin coating, development, etching, removing photoresist resin coating and washing must be made accordingly. It results in an additional burden of manufacturing steps and an increase in production cost.

In order to reduce the number of such steps a pattern of the thick resin isolation film, for instance, may be used for a mask pattern as it is to perforate a gate isolation film and the like to make holes, i.e., contact holes of the thick resin isolation film are provided to be consistent with those of the gate insulation and the like.

In this case, however, side etching or the like of the gate insulation film makes overhanging portions and causes discontinuity between electrically conductive films coating the contact holes (i.e., a rift or break at a step defined between conductive films).

SUMMARY OF THE INVENTION

It is accordingly an object of the present invention to provide a display device with improved productivity and a method of manufacturing the same Another object of the present invention is to provide a display device with prevention of electrical discontinuity of electrically conductive films coating contact holes and a method of making the same.

A further object of the present invention is to provide a display device capable of substantial production cost reduction and a method of manufacturing the same.

A still further object of the present invention is to provide a method of manufacturing a display device with simplification of manufacturing processes.

An array substrate for a display device of the present invention includes a substrate; a first electrically conductive film formed over the substrate; a first insulation film formed on the first electrically conductive film, the first insulation film having a first contact hole on a place corresponding to the first electrically conductive film; a second electrically conductive film; a second insulation film having a second contact hole, the second contact hole being covered with the second electrically conductive film to define an aperture; and a third electrically conductive film formed on the first insulation film and connected to the first electrically conductive film, wherein an upper end portion of the first contact hole of the first insulation film is substantially the same in diameter as the aperture defined in the second contact hole covered with the second electrically conductive film.

The array substrate for a display device of the invention is characterized in that the second insulation film is made of equal to or more than 1 μm in thickness resin.

The array substrate for a display device of the invention is further characterized in that pixel electrodes in matrix made of at least the same one of either the second and third electrically conductive films.

The array substrate for a display device of the invention is characterized in that the pixel electrodes are made of the second and third electrically conductive films and that one of the second and third electrically conductive films is optically transparent and the other is optically reflective.

The array substrate for a display device of the invention is characterized in that the array substrate is used for a transparent/reflection type liquid crystal display device.

The array substrate for a display device of the invention is characterized in that the second insulation film has a substantially uneven pattern at a place corresponding to the pixel electrode made of the optically reflective film.

The array substrate for a display device of the invention is characterized in that the second insulation film includes an aperture at a place corresponding to the pixel electrode made of the optically transparent and electrically conductive film.

The array substrate for a display device according to the invention is characterized in that the array substrate is used for an organic electro-luminescence display device.

The array substrate for a display device of the invention is characterized in that the second and third electrically conductive films are made of the same materials as anode and cathode electrodes of the organic electro-luminescence display device.

A method of making an array substrate for a display device of the present invention includes the steps of making a first electrically conductive film on an insulation substrate; forming a first insulation film to cover the first electrically conductive pattern; forming a second insulation film on the first insulation film, the second insulation film having a second aperture at a place corresponding to the first electrically conductive film; making second electrically conductive film on the second insulation film; first patterning of the second electrically conductive film by using a pattern photomask with a contact hole made smaller in diameter than the second aperture; second patterning to expose the first electrically conductive film wherein etching the first insulation film is carried out by using the photomask and through the aperture of the second electrically conductive film to make a first aperture larger in diameter than the contact hole of the second electrically conductive film; third patterning of the second electrically conductive film by using the first aperture of the first insulation film; and removing the pattern photomask and forming third electrically conductive film connected to the first electrically conductive film through the contact holes of the second electrically conductive films.

The method of making an array substrate for a display device according to the invention further includes the steps of making a third insulation film between the first and second insulation films, wherein the third insulation film is subjected to the etching step of the first insulation film.

The method of making an array substrate for a display device of the invention is characterized in that the second patterning step carries out side etching of the third insulation film at a speed faster that that of the first insulation film.

The method of making an array substrate for a display device of the invention is characterized in that the first insulation film is made of upper and lower insulation films and second patterning step carries out side etching of the upper insulation film at a speed faster that that of the lower insulation film.

The method of making an array substrate for a display device of the invention is characterized in that the second etching step carries out wet etching.

The method of making an array substrate for a display device of the invention is characterized in that the wet etching uses etching solution of buffered hydrofluoric acid.

The method of making an array substrate for a display device of the invention is characterized in that the second etching carries out dry etching.

BRIEF DESCRIPTION OF THE DRAWINGS

A more complete appreciation of the present invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

First Embodiment (FIGS. 1–9)

Figure 1A:
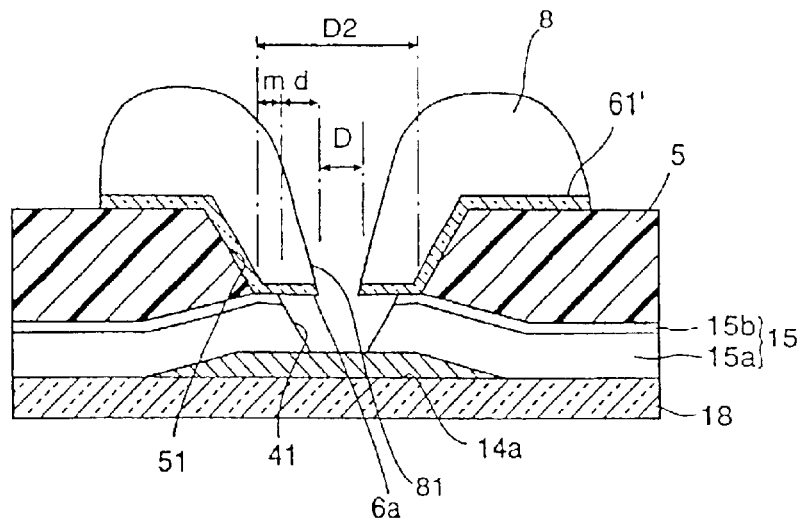
FIGS. 1A through 1C schematically show sectional views of components to explain manufacturing steps of the present invention (first embodiment)
Figure 1B:
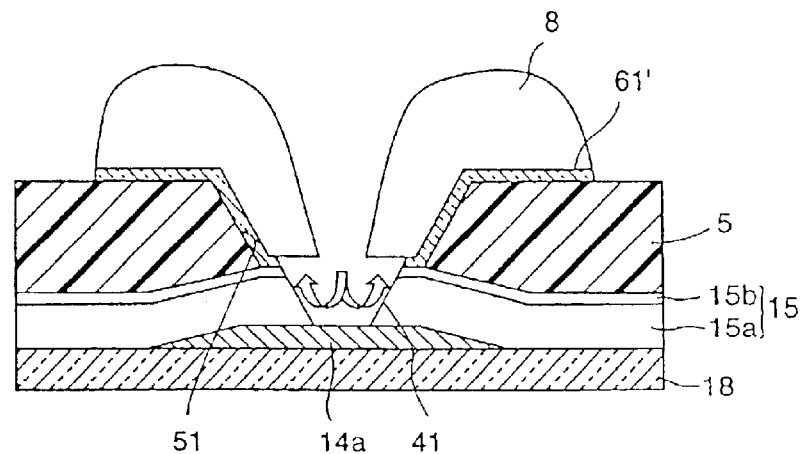
Figure 1C:
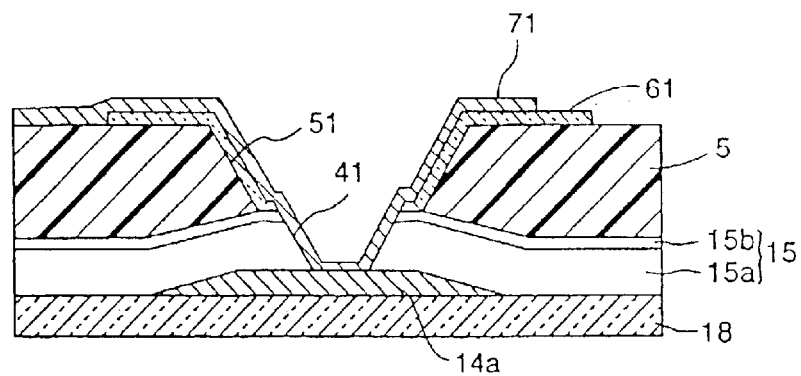
Figure 2:
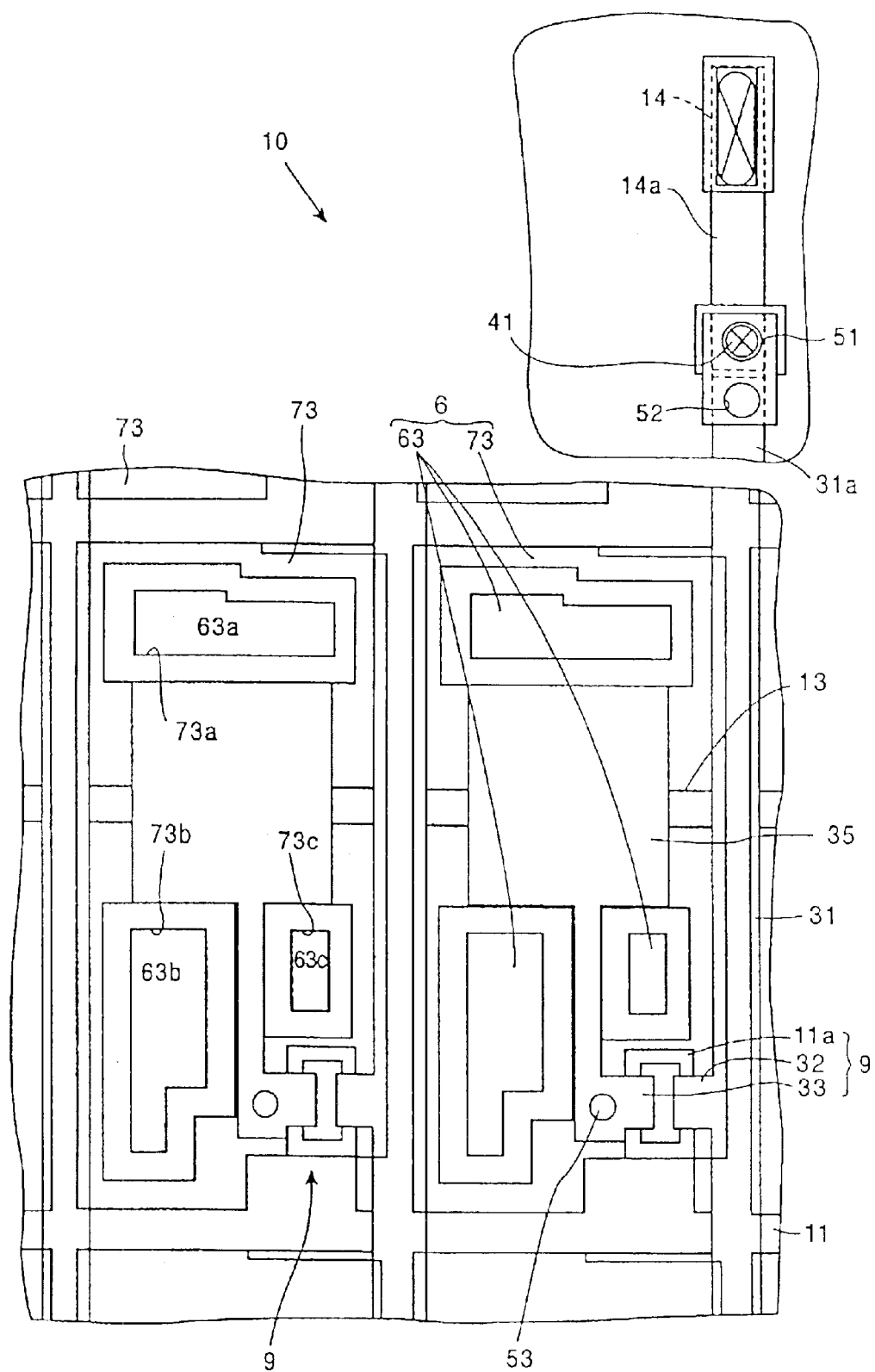
FIG. 2 is a plan view of a TFT array substrate of the present invention (first embodiment)
Figure 3:
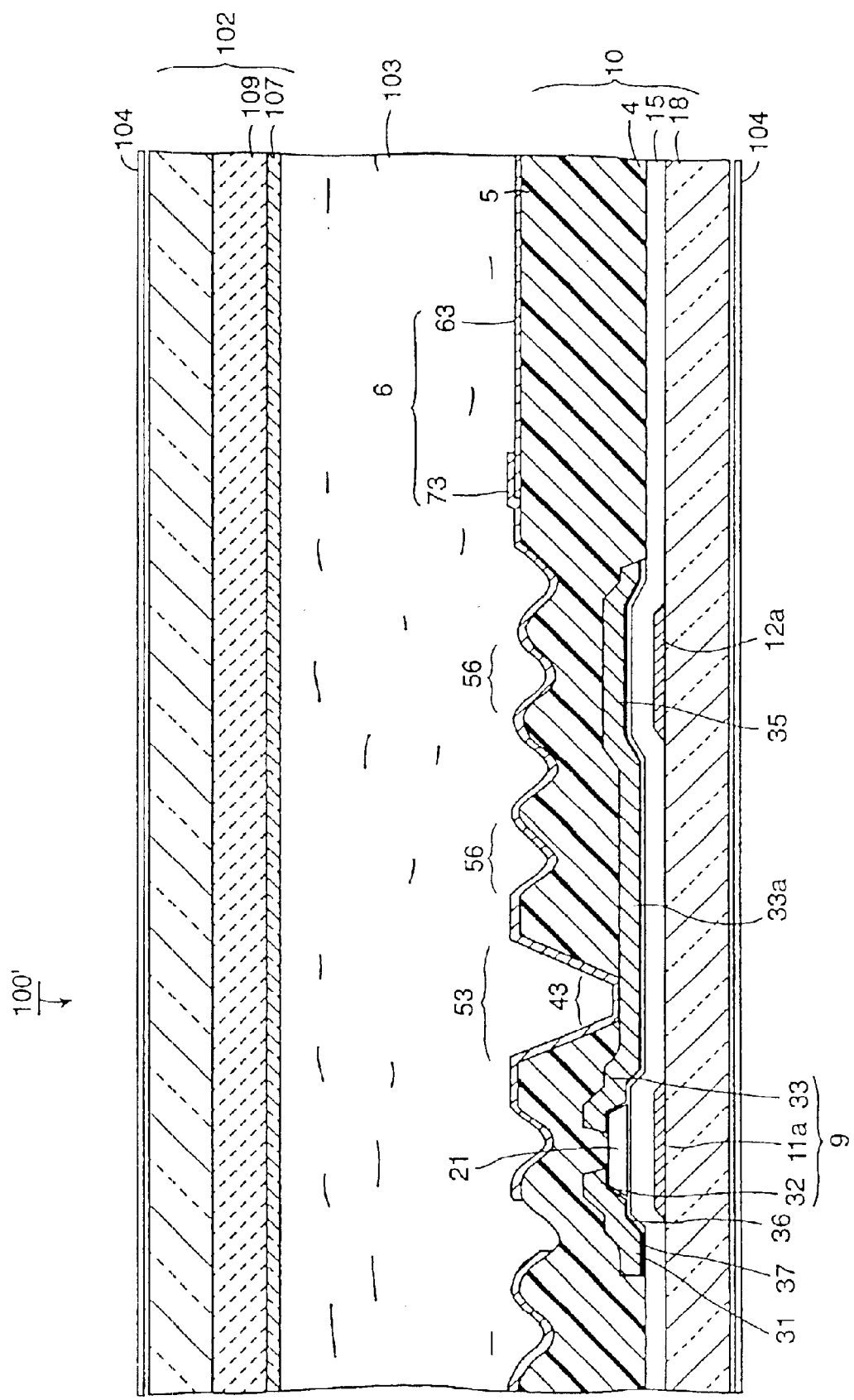
FIG. 3 is a sectional view of a pixel portion of a display panel of the present invention (first embodiment)
Figure 4:
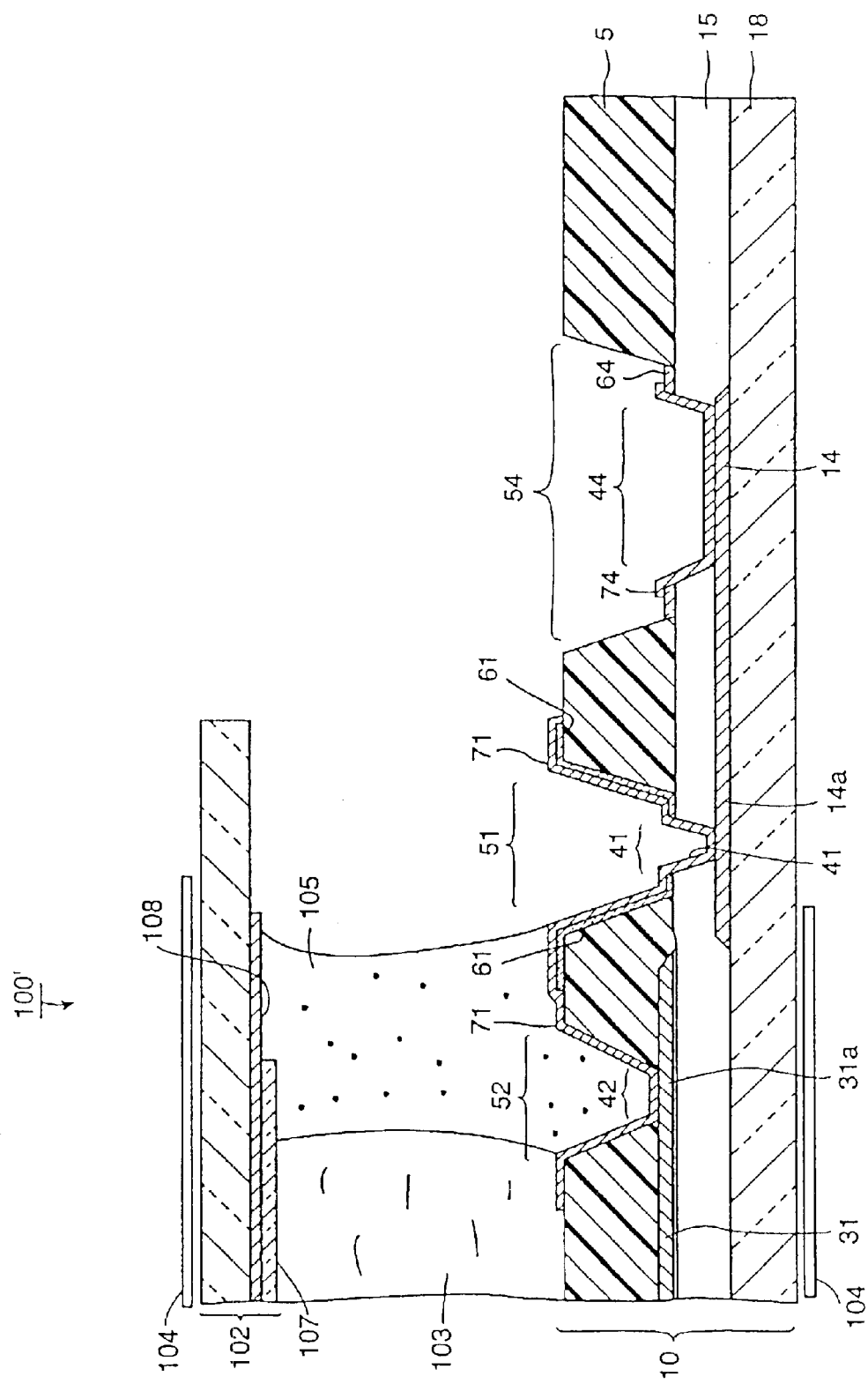
FIG. 4 is a sectional view of a peripheral portion of the display panel of the present invention (first embodiment)

A first embodiment of the present invention will be described below with reference to FIGS. 1 through 9. FIGS. 1A through 1C show schematically sectional views of components to explain manufacturing steps of the present invention. FIG. 2 is a schematic plan view of a TFT array substrate. FIGS. 3 and 4 are sectional views of pixel and peripheral portions of a display panel on the TFT array substrate, respectively.

First, the structure of the TFT array substrate is explained with reference to FIGS. 2, 3 and 4. The TFT array substrate 10 includes scanning lines 11, signal lines 31, pixel electrodes 6 and thin film transistors 9. The scanning and signal lines 11 and 31 are disposed on the TFT array substrate 10, and the signal lines are arranged above scanning lines. The thin film transistors 9 are provided at the vicinities of intersections of the scanning and signal lines. The thin film transistors 9 are turned on or off to switch input signals from the signal lines 11 to the pixel electrodes 6 in response to pulse signals supplied to gates. Gate electrodes 11a and drain electrodes 32 of the thin film transistors 9 are made of portions extending from the scanning and signal lines 11 and 31, respectively. The source electrodes 33 of the thin film transistors 9 are electrically connected to the pixel electrodes 6 through upper contact holes 53 made at an optically transparent thick resin insulation film 5.

The pixel electrodes 6 are electrically isolated from each other at square areas (pixel dot areas) defined by the scanning and signal lines 11 and 31 and each substantially cover the entire square areas, and their both side-portions are overlapped with the signal lines 31. The pixel electrodes 6 are each made of metal and consist of combinations of reflection type pixel electrodes 73 and optically transparent pixel electrodes 63a, 63b and 63c made of ITO etc. in this particular embodiment. The optically transparent pixel electrodes 63a, 63b and 63c are disposed at places corresponding to three window-like apertures 73a, 73b and 73c of the reflection type pixel electrodes 73, so that the inner fringes of the window-like apertures 73a, 73b and 73c are directly overlapped with the outer portions of the optically transparent pixel electrodes 63a, 63b and 63c to make them electrically conductive. The reflection type pixel electrodes 73 are uneven in configuration to improve optically scattering effects. The optically transparent thick resin insulation film 5 is equal to or more than 1 µm in thickness and made of lower dielectric constant insulation materials.

Photoresistive type organic resins, such as acrylic resins, are particularly suitable for the optically transparent thick resin insulation film 5. The optically transparent thick resin insulation film 5 covers substantially entire portions of the TFT array substrate 10 except those provided with connecting pads 14 and upper contact holes 51, 52 and 53.

Central portions of the pixel dot areas particularly covered by the reflection type pixel electrodes 73 define auxiliary capacitors for the pixel electrodes arranged in overlap with auxiliary capacitor electrodes 12a of auxiliary capacitor lines 12 made of the same material as the scanning lines 11 and auxiliary capacitor electrodes 35 for the auxiliary capacitors.

As shown in FIGS. 2 and 4, the connecting pads 14 are provided at bare regions 54 of the optically transparent thick resin insulation film 5 in connecting peripheral portions of the TFT array substrate 10. The connecting pads 14 are made of the same material, and at the same manufacturing step, as the scanning lines 11. The connecting pads 14 include extending connection lines 14a electrically connected to end portions 31a of the signal lines 31 through lower and upper contact holes 41, 51 and 52 and bridge-like electrically connecting films 71 covering the lower and upper contact holes 41, 51 and 52. The lower contact holes 41 perforated through the gate insulation film 15 are made on the bottom of the upper contact holes 51 at end portions of the connection lines 14a. End portions 31a of the signal lines 31 are, however, provided only with the upper contact holes 52 perforated through the thick resin insulation film 5.

FIGS. 1A through 1C show manufacturing steps of the lower contact holes 41 provided at the coneting lines 14a of the connecting pads 14 in the inside portion of the TFT array substrate. The manufacturing steps are briefly outlined next.

First, a photoresist pattern 8 is disposed over a pattern of the optically transparent thick resin insulation film 5. The photoresist pattern 8 includes an aperture 81 at the upper contact hole 51 perforated through the thick resin insulation film 5. The aperture 81 is smaller in diameter that the contact hole 51. Under the photoresist pattern 8 the following wet-etching steps (1) through (3) are carried out: A manufacturing step (4) is then fulfilled to form the bridge-like electrically conductive film 71.

Figure 7:
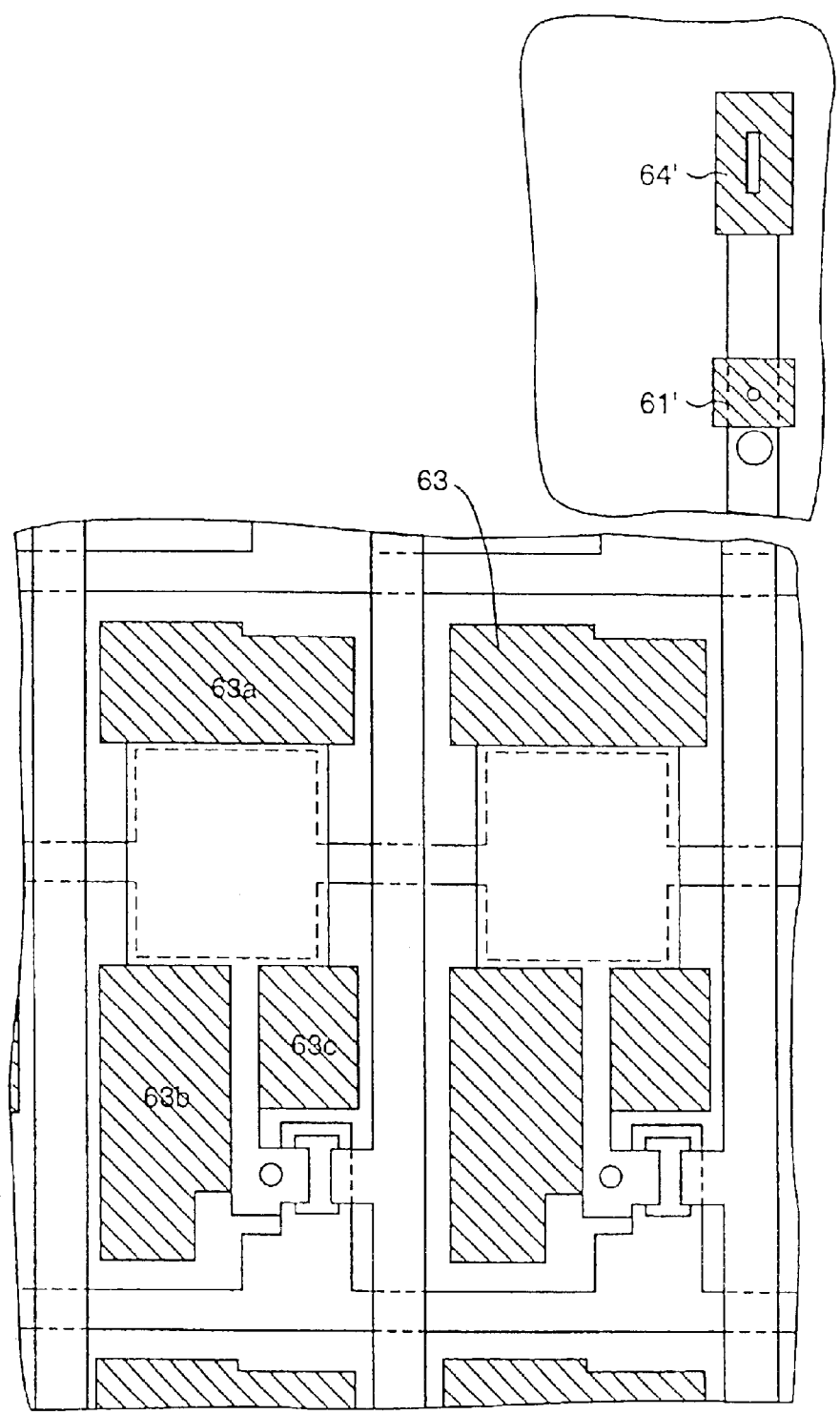
FIG. 7 is a fragmentary plan view of a first etching stage in a fifth patterning step of the TFT array substrate of the present invention (first embodiment)

(1) First Etching Step (ITO Pattern Formation: FIG. 7)

An oxalic acid solution for the wet-etching of exclusively an amorphous indium-tin-oxide (a-ITO) film carries out the patterning along contours of the photoresist pattern 8. An ITO film pattern 61' is formed to cover the upper contact hole 51 and its vicinity except the inside of the contour of the aperture 81. At the same time the optically transparent pixel electrodes 63a, 63b and 63c are made in the pixel area.

(2) Second Etching Step (Perforation of Through Holes)

The wet-etching solution is performed for the gate insulation film 15 made of silicon oxide, etc. to make the lower contact hole 41 perforated through the gate insulation film 15. Since this etching causes significant side etching it makes the contact hole 41 relatively bigger in diameter than in the case of the aperture 81 of the photoresist pattern 8. Thus, it forms an "eaves" portion 6a between a lower fringe portion of the aperture 81 and an upper fringe portion of the lower contact holes 41.

Figure 8:
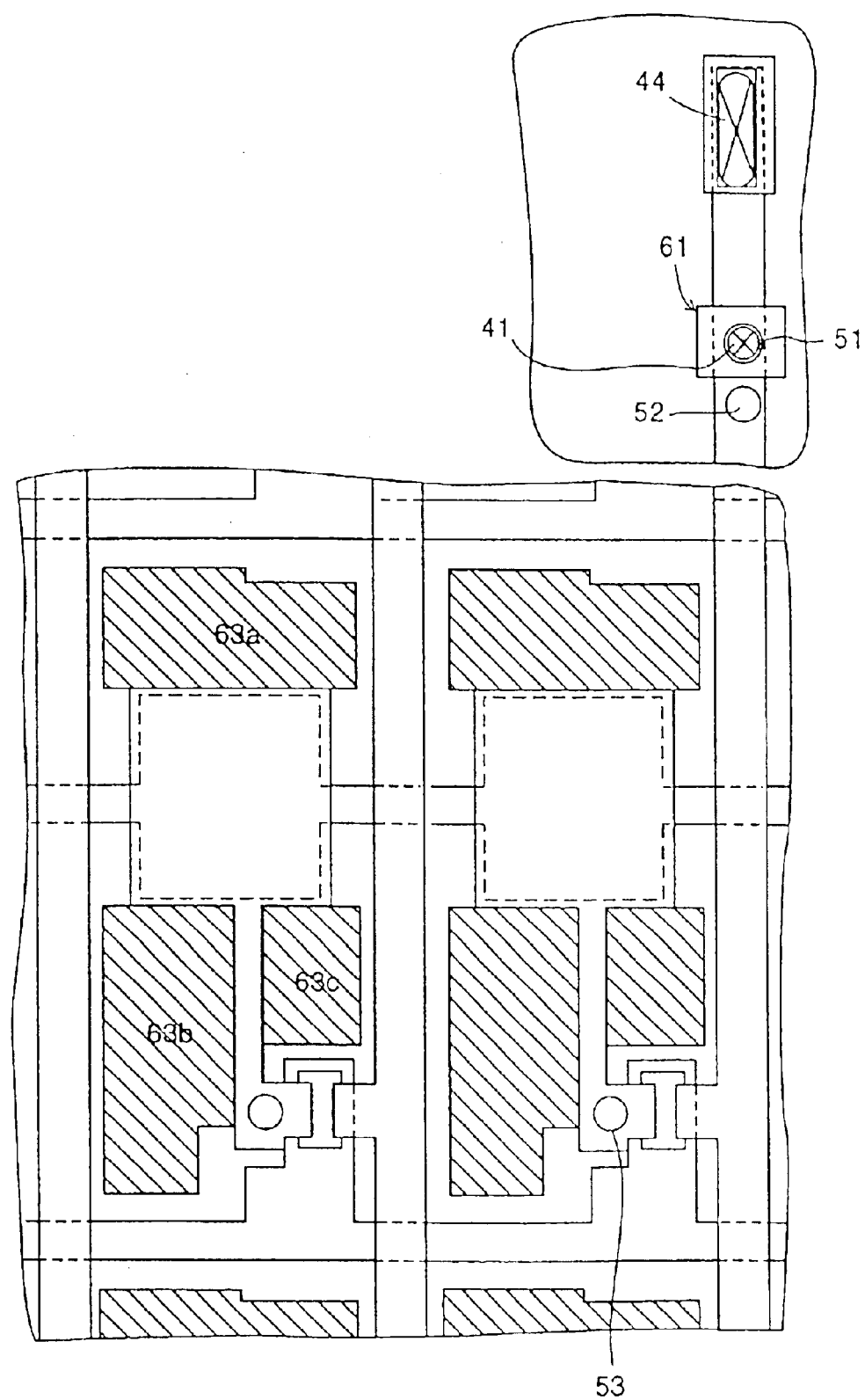
FIG. 8 is a fragmentary plan view of completion of the fifth patterning step of the present invention (first embodiment)

(3) Third Etching Step (ITO Back Etching: FIG. 8)

The "eaves" portion 6a is removed by using the oxalic acid solution again. In this case, the etching solution affects from the back side of the photoresist pattern 8 through the lower contact holes 41 made in the second etching step (2) described above, i.e., the back etching is carried out.

As a result of a series of those patterning steps, a perforated ITO film patch 61 is formed on the contact holes but does not cover the lower contact hole 41 which is omitted. Then, separation of the photoresist pattern 8, washing, and annealing of the a-ITO film (crystallization by heating) are carried out.

Figure 9:
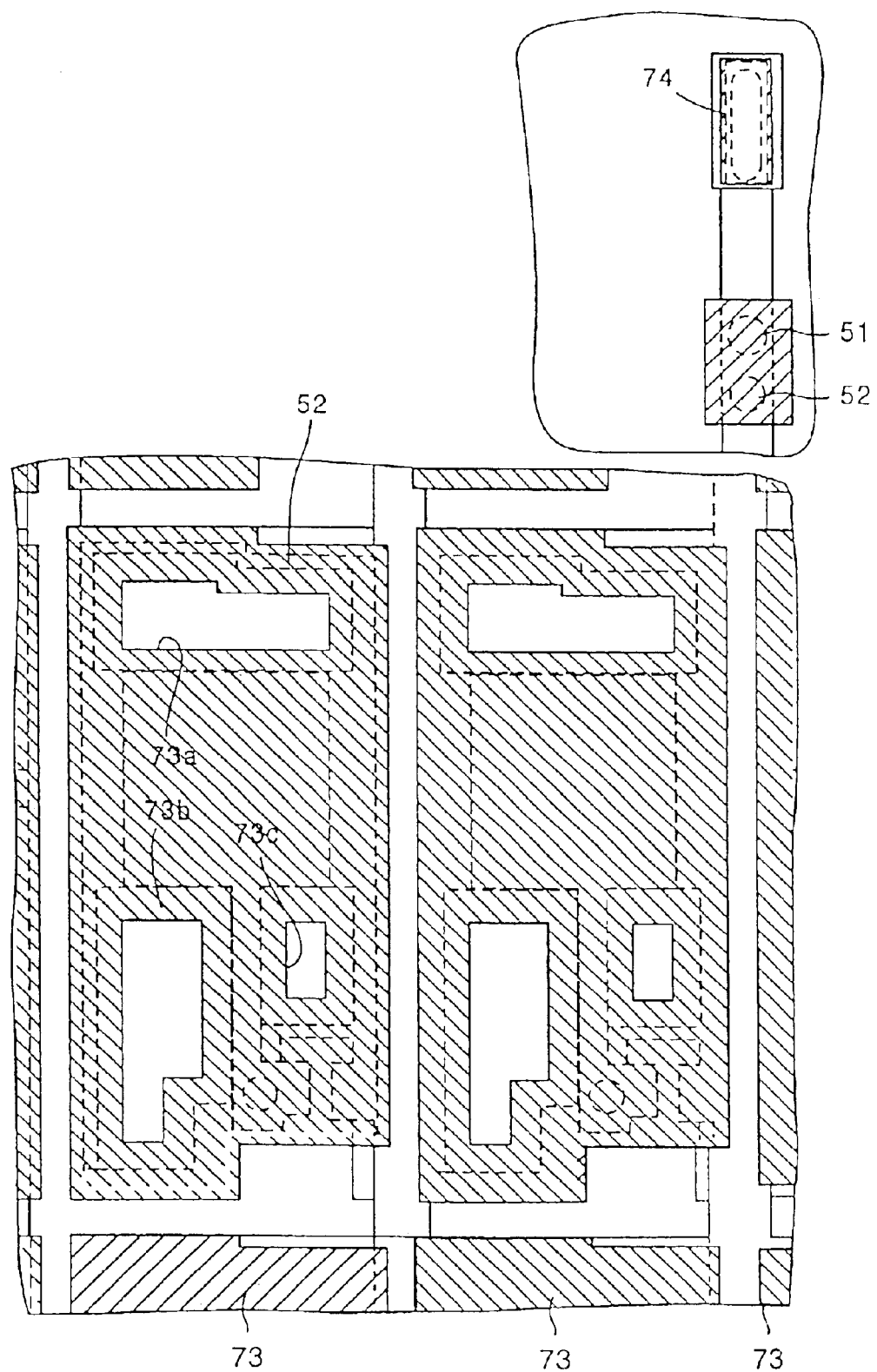
FIG. 9 is a fragmentary plan view of a sixth patterning step of the present invention (first embodiment)

(4) Formation of Top Metal Pattern (FIG. 9)

The steps of coating a photoresist, exposure with a photomask and development are performed after depositing molybdenum and then aluminum (Mo/Al) films. The bridge-like electrically conductive film 71 is formed by etching to cover the region from the lower and upper contact holes 41 and 51 to the neighboring upper contact holes 52. At this time, the reflection type pixel electrode 73 is made in the pixel region.

Next, with reference to FIGS. 5 through 8, production steps of the TFT array substrate 10 are described in detail. Where the TFT array substrate 10 is manufactured, wiring and film forming patterns for the liquid crystal display devices each are made per predetermined size (e.g., 2.2 inches in diagonal length) on a larger size mother TFT array substrate (e.g., 550 mm×650 mm). After that, a larger size mother counter substrate similarly prepared is put together with the larger size mother TFT array substrate through spacers by sealant, cell structures each corresponding to the liquid crystal display devices are cut out from it, respectively.

Figure 5:
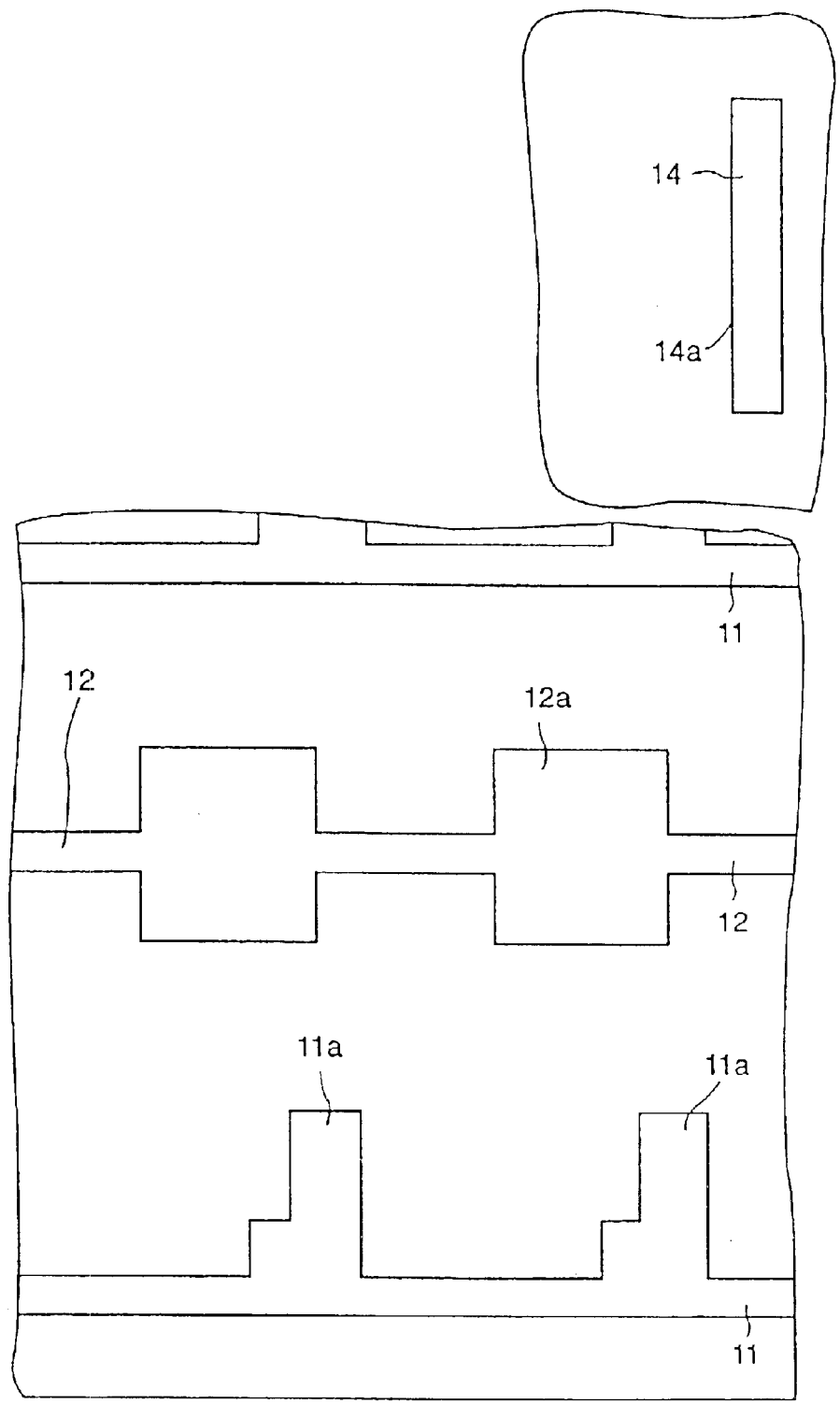
FIG. 5 is a fragmentary plan view of a first patterning step of the TFT array substrate of the present invention (first embodiment)

First Patterning (FIG. 5)

(1) A sputtering method is applied to deposit a 230 nm thick molybdenum and wolfram (MoW) alloy film on a glass substrate 18. A patterning step using a first photomask forms 176 scanning lines 11, gate electrodes 11a extending from the scanning lines, respectively, signal lines 31 and auxiliary electrical capacitor lines (Cs wiring lines) 12 with the same number of lines as that of the signal lines 31 per diagonally 2.2-inch (56 mm) long rectangular region. The auxiliary electrical capacitor lines 12 each are disposed approximately in the middle of the neighboring scanning lines 11 and include substantially rectangular and auxiliary capacitor electrodes at locations kept away from those in the vicinities of the signal lines 31. At the same time, the connecting pads 14 and connection lines 14a extending from the connecting pads 14 are made at the peripheral portions.

(2) Second Patterning (FIG. 1)

As shown in FIG. 1, in order to make the thin film transistor 9, a first gate insulation film 15a made of 350 nm thick silicon oxide (SiOx) is formed on the glass substrate 18 and the gate electrode 11a. After the surface of the first gate insulation film 15a is treated with the oxalic acid solution, a second gate insulation film 15b with a thickness Of 40–50 nm made of silicon nitride (SiNx), a semiconductor layer 36 made of 50 nm amorphous silicon (a-Si:H), a 200 nm thick silicon nitride (SiNx) used for a channel protection film 21, etc. are successively deposited on the first gate insulation film 15b without exposing them to the air (See FIG. 1).

After coating a photoresist, the channel protection film 21 is formed by applying a back exposure process technology making use of patterns of the scanning lines 11 etc. obtained from this first patterning step as masks.

Figure 6:
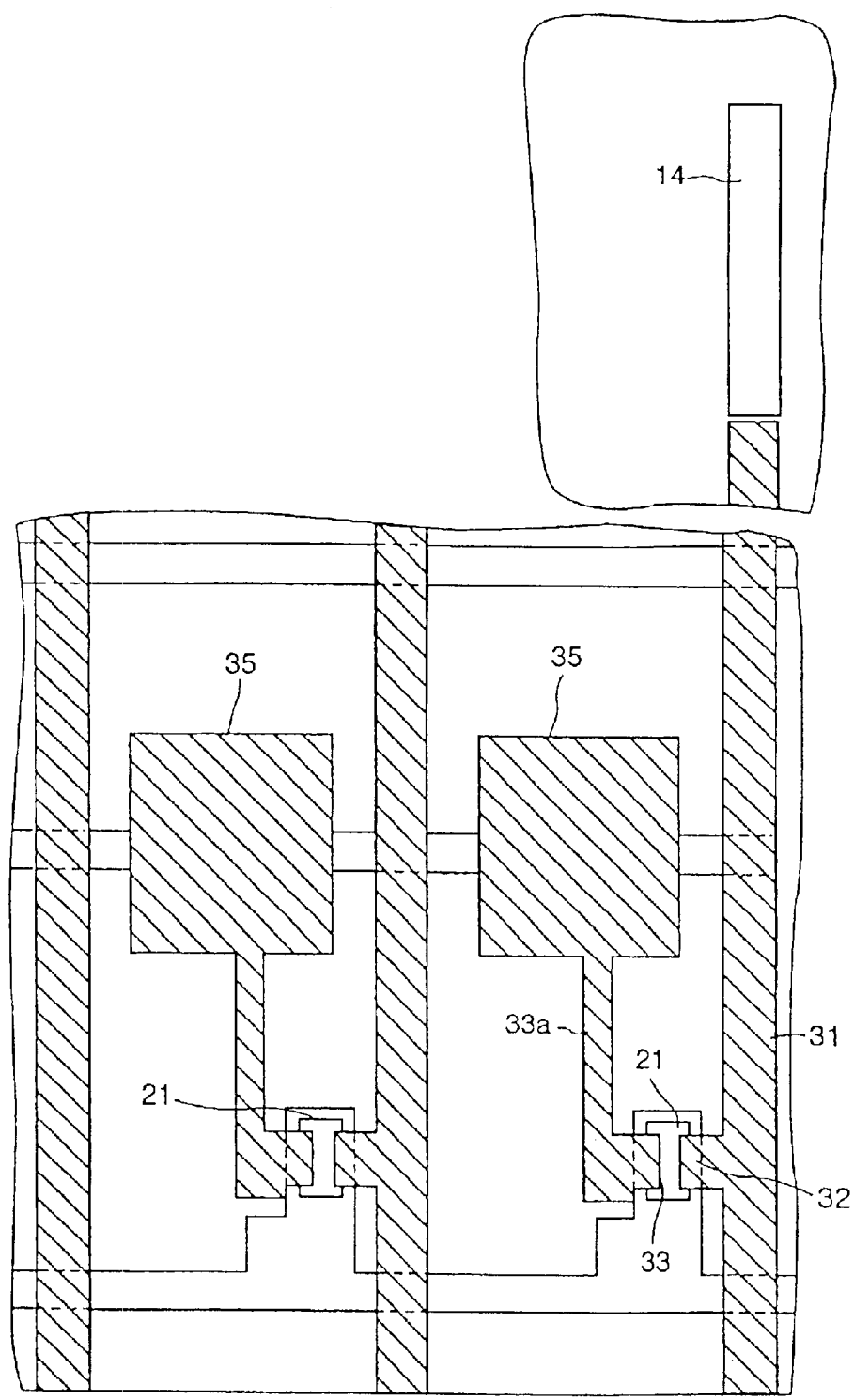
FIG. 6 is a fragmentary plan view of a third patterning step of the TFT array substrate of the present invention (first embodiment)

Third Patterning (FIGS. 3 and 6)

After the exposed surface of the amorphous silicon (a-Si:H) layer is treated with the oxalic acid solution, a chemical vapor deposition ("CVD") method is applied to form a 20 nm thick phosphor doped amorphous silicon ($n^+$a-Si:H) to make a low electric resistance semiconductor layer 37 with a good ohmic contact.

A sputter method is then applied to deposit three-metal (Mo/Al/Mo) layers made of 25 nm thick molybdenum (Mo) at the bottom, 250 nm thick aluminum (Al) in the middle and 50 nm thick molybdenum (Mo) at the top.

Further, the photoresist is exposed and developed by using a third photomask, and the a-Si:H layer, $n^+$a-Si:H layer and Mo/Al/Mo layers are collectively subjected to patterning. This third patterning makes 220×3 signal lines 31, drain electrodes 32 extending from the signal lines 31 and source electrodes 33 per diagonally 2.2-inches (56 mm) long rectangular region.

At the same time, auxiliary capacitor electrodes (Cs patterns) 35 are provided to overlap and to be slightly bigger in size around their periphery than the auxiliary capacitor electrodes 12a of the auxiliary capacitor lines 12. The auxiliary capacitor electrodes 35 are rectangular patterns further extending from straight lines 33a connected to the source electrode 33 disposed along the signal lines 31 connected to the drain electrodes 32.

(4) Fourth Patterning

A positive photosensitive resin liquid is uniformly coated on the multi-layer patterns made by the patterning steps set forth above in order for the resin to become 2 μm in thickness in a solid state. After that, as will be explained below, the steps of exposure, development and irradiation of ultraviolet accelerate chemical reactions in the thick resin insulation film to improve its transparency.

Strong exposures are carried out for the upper contact holes 51, 52 and 53 and bare regions 54 for the connecting pads 14 but weak exposures are carried out for concaves 56 in the reflective pixel electrode regions (see FIGS. 2 and 3).

Two photomasks, for instance, are prepared for the strong and weak exposures. The strong and weak exposures are basically determined by adjustment of exposures intensity and time, i.e., exposure quantity of accumulated effective light rays.

Portions subjected to the strong exposure make the upper contact holes 51 and bare regions 54 perforated through the thick resin insulation film 5 but those subjected to the weak exposure make the concaves 56 with 1 μm depth, for example.

A plurality of the concaves 56 made in the regions of the reflection type pixel electrodes 73 become the uneven patterns to provide the pixel electrodes 73 with optically scattering functions.

The thick resin insulation film 5 functions as a film to make the liquid crystal layer uniform in thickness where the liquid crystal display device is assembled. The thick resin insulation film 5 is further used to overlap the pixel electrodes 6 with the signal lines 31, etc. so that it also improves the optical utilization efficiency.

In place of the positively photosensitive resin described above, the thick resin insulation film may be made of a negatively photosensitive resin. In this case, portions subjected to no exposure and strong exposure are opposites of each other but those subjected to weak exposure remain unchanged. The different accumulated exposure quantities may be achieved by a half tone patterning using a photomask with mesh patterns used in predetermined regions instead of the two photomasks as described above.

(5) Fifth Patterning (FIGS. 1, 7 and 8)

A 40 nm thick a-ITO film is formed on the optically transparent thick resin insulation film 5 as a transparent electrically conductive film layer. Subsequently, the a-ITO film is subjected to photoresist coating, exposure and development. Under the photoresist pattern 8, the following three-step etching operations are carried out. The photoresist pattern 8 has an aperture corresponding to the upper contact hole 51. The diameter of the aperture 81 at the connecting lines 14a of the connecting pad 14 is smaller than the inner diameter of the upper contact hole 51 (aperture diameter at the bottom).

(5-1) Formation of ITO Pattern (FIG. 7)

A wet etching with the oxide acid solution for 50 sec at 45° C. removes the a-ITO film entirely except those covered by the photoresist pattern 8, i.e., the etching makes an a-ITO film pattern in accordance with the photoresist pattern 8. Thus, the transparent pixel electrode 63 consisting of three rectangular patterns of the optical transparent pixel electrodes 63a, 63b and 63c is made per pixel dot. At the same time, the ITO film pattern 61' is formed to cover the surfaces of the upper contact hole 51 at the periphery portion of the TFT array substrate and a pad covering ITO pattern 64' to cover the connecting pad 14 except a small rectangular portion of the connecting pad 14 at its center region.

(5-2) Formation of Through Holes (FIG. 1A)

Next, an etching solution of buffered hydrofluoric acid (BHF: hydrofluoric acid-ammonium fluoride buffered solution) is sprayed to necessary portions for a period of 120 sec. at a temperature of 28° C., for example. The etching solution removes the gate insulation film 15 at the bottom region of the upper contact hole 51 to expose the upper surface of the connecting lines 14a of the connecting pads 14. The buffered hydrofluoric acid solution includes, for instance, 6% hydrofluoric acid and 30% ammonium fluoride. The etching time is determined to avoid excessive side-etching and to make the inner wall slope of the lower contact hole 41 at an angle of about 45°.

As shown in FIG. 1A, the wet etching to make through holes causes, more or less, the side-etching at the gate insulation film 15. Thus, the inner diameter "D" (at the bottom) of the aperture 81 of the photoresist pattern 8 is smaller than the inner diameter "D2" at the bottom of the upper contact holes 51, 52 or 53 by the size "d" of the side etching at both sides plus a slight margin (tolerance) "m", i.e., D=D2−2 (d+m). The margin "m" is about 2 μm in this embodiment.

Inconsideration of some variations of the side-etching conditions, the margin "m" is set up, the upper edge of the lower contact hole 41 perforated through the gate insulation film 15 is designed to be necessarily an inner side from the corresponding lower edge of the upper contact hole 51 perforated through the optically transparent thick resin insulation film 5. Even where an overhanging or step portion is made on the electrically conductive film to cover the walls of the contact holes, the present invention substantially prevents electric discontinuity from taking place at such a step ("eaves") portion.

(5-3) Back-etching of a-ITO Film (FIGS. 1C and 8)

The oxalic acid etching solution is used for a period of 15 sec. at a temperature of 45° C., for instance, to remove the "eaves" portion of the a-ITO film resulting from side-etching of the gate insulation film 15. As schematically shown in FIG. 1B, the etching solution reaches the back of the photoresist pattern 8 so that "back-etching" is carried out. After completion of this back-etching, the photoresist pattern 8 is removed and the a-ITO film is washed out and annealed for crystallization.

Meanwhile, after the back-etching, the a-ITO film remains to cover the upper contact holes 51 and a step is made at a joint portion of the upper and lower contact holes 51 and 41. Further, exposure portions of the lower contact holes 41 and the connecting pads 14 are removed from ITO film pattern 61' and pad covering ITO film pattern 64', so that hem-like ITO film patch 64 is formed to surround a one hole ITO film patch 61 and the exposure portion of the connecting pads 14 at the peripheral portion of the TFT array substrate.

(6) Sixth Patterning (FIGS. 1C, 4 and 9)

A sputter method is applied to deposit double layers of 50 nm thick molybdenum (Mo) and aluminum (Al), i.e., Mo/Al layers. A photoresist pattern is then made with a photomask. A wet etching patterning step is subsequently carried out to make a bridge-like electrically conductive film 71 covering a pair of neighboring lower contact holes 41 and 42, a pad covering portion 74 and a reflection type pixel electrode 73 covering a major part of a pixel dot.

The reflection type pixel electrode 73 includes the window-like apertures 73a, 73b and 73c configured to expose the optically transparent pixel electrodes 63a, 63b and 63c except their peripheral portions in each pixel dot, respectively. Thus, the reflection type pixel electrode 73 is overlapped with, and connected to, the optically transparent pixel electrodes 63a, 63b and 63c at their peripheral portions.

The reflection type pixel electrode 73 covers the thin film transistor 9 and is directly connected to the source electrode 33 of the thin film transistor 9 through upper and lower contact holes 43 and 53. The portion of the reflection type pixel electrode 73 along the signal line 31 is overlapped with portions of the signal lines 31 through the optically transparent thick resin insulation film 5. Thus, the steps described above complete to make a plurality of the TFT array substrates 10 on the larger size mother substrate.

The counter substrates 102 incorporated with the TFT array substrates are formed on the larger size mother substrate by the steps of (i) forming optically shielding patterns (black matrix patterns) 108; (ii) making red (R), green (G) and blue (B) color filter layers 109 in each pixel dot; (iii) making column spacers; and (iv) forming an ITO film used for the counter electrode 107.

Sealant 105 is then coated on either one of the larger size mother substrates, pressure is added to them, and the sealant is hardened to incorporate them. Further, liquid crystal display cells are cut out from them by scribing, liquid crystal material 103 is injected into the cells from their inlets, and a sealant is again used to seal the inlets. Thus, a liquid crystal display panel 100 is produced, tape carrier packages and driver circuit boards are connected to the panel 100 and a rear light source is assembled with it. Thus, a liquid crystal display device is completed.

The surfaces of the TFT array and counter substrates 10 and 102 on the liquid crystal layer sides (not shown in FIGS. 3 and 4) are coated with alignment layers made of polyimide resin, which are, in turn, subjected to rubbing treatment in order to make the liquid crystal molecules align in a predetermined direction, respectively. In addition, polarizers 104 are attached to the outer surfaces of the TFT array and counter substrates 10 and 102, respectively.

FIRST COMPARISON EXAMPLE

Next, a method of making a first comparison example will be explained with reference to FIGS. 10A and 10B.

In this method, the patterning of a gate insulation film is carried out by using a pattern of a thick resin insulation film 5 as a photomask. As in the first embodiment of the present invention, the BHF-solution is used to etch silicon oxide film or silicon oxide and nitride films at the same time.

Figure 10A:
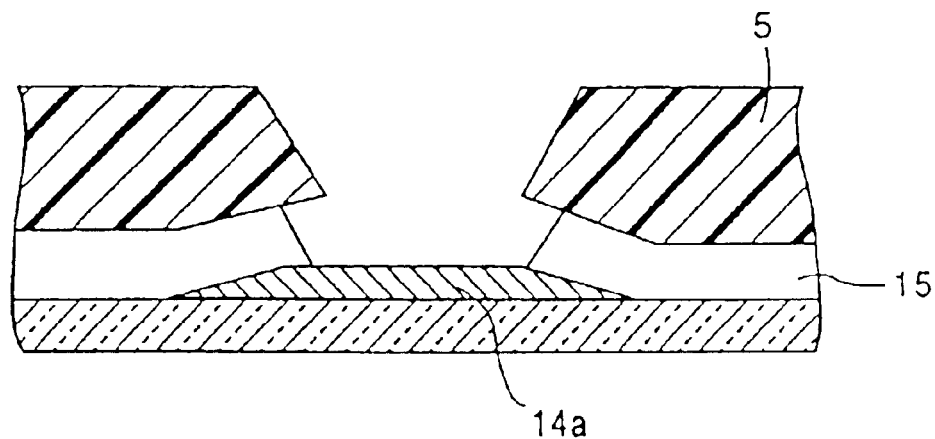
FIGS. 10A and 10B schematically show sectional views of a TFT array substrate to explain manufacturing steps of a first comparison example.
Figure 10B:
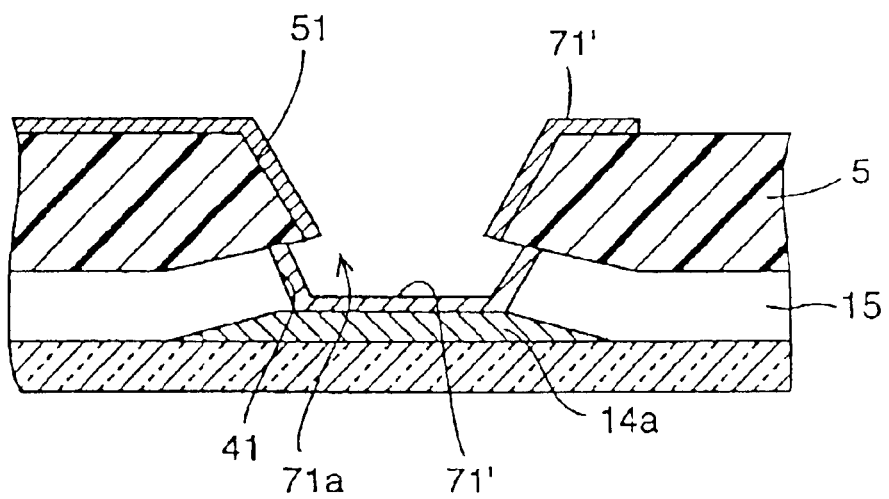

As a result, the lower end portion of the upper contact hole 51 projects much closer into the inside than the upper end portion of the lower contact hole 41 due to the side-etching and an overhanging portion is formed on the entire surrounding of the lower contact hole 41 as shown in FIG. 10A. Thus, where a metal film 71' is coated on the upper and lower contact holes 51 and 41, electrical "discontinuity" 71a of the metal film 71' is made between them.

Second Embodiment (FIGS. 11–19)

A second embodiment of a TFT array substrate and a method of making the same in accordance with the present invention will be described below with reference to FIGS. 11 through 19.

Figure 11A:
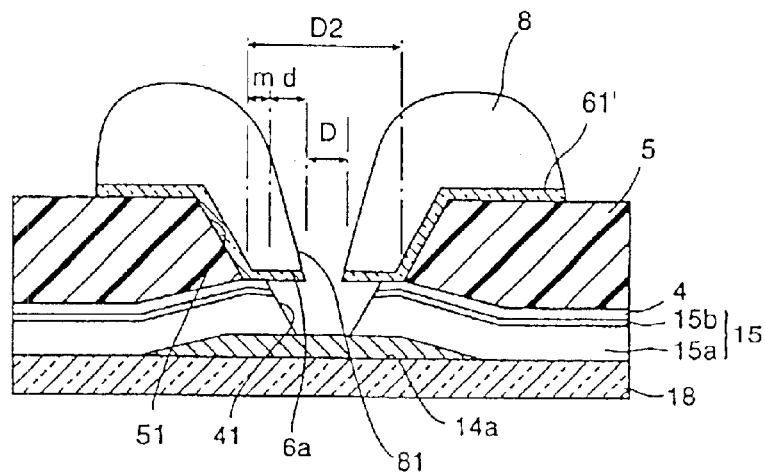
FIGS. 11A through 11C schematically show sectional views of a TFT array substrate to explain manufacturing steps of the present invention (second embodiment)
Figure 11B:
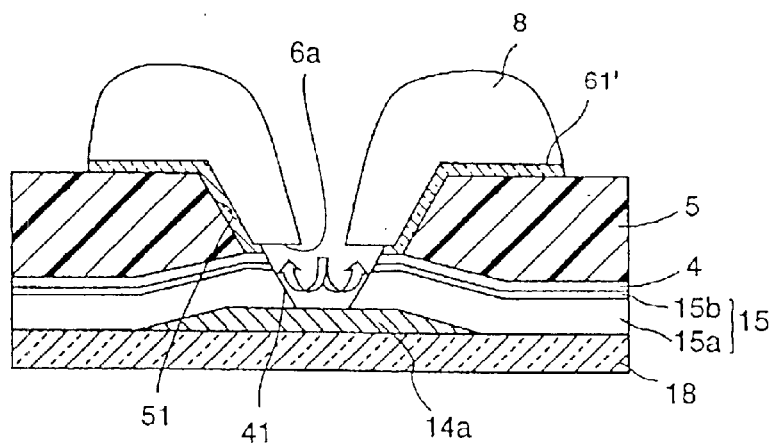
Figure 11C:
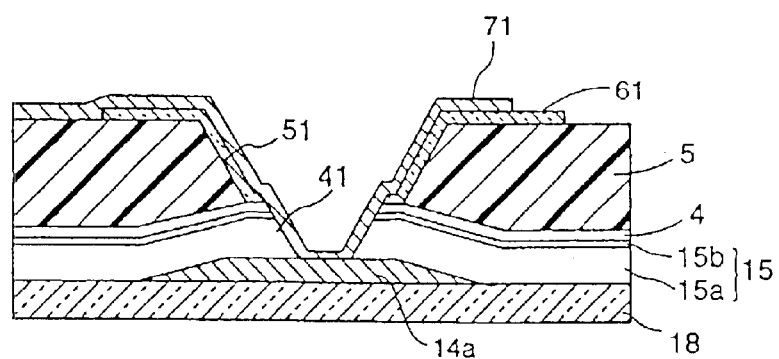
Figure 12:
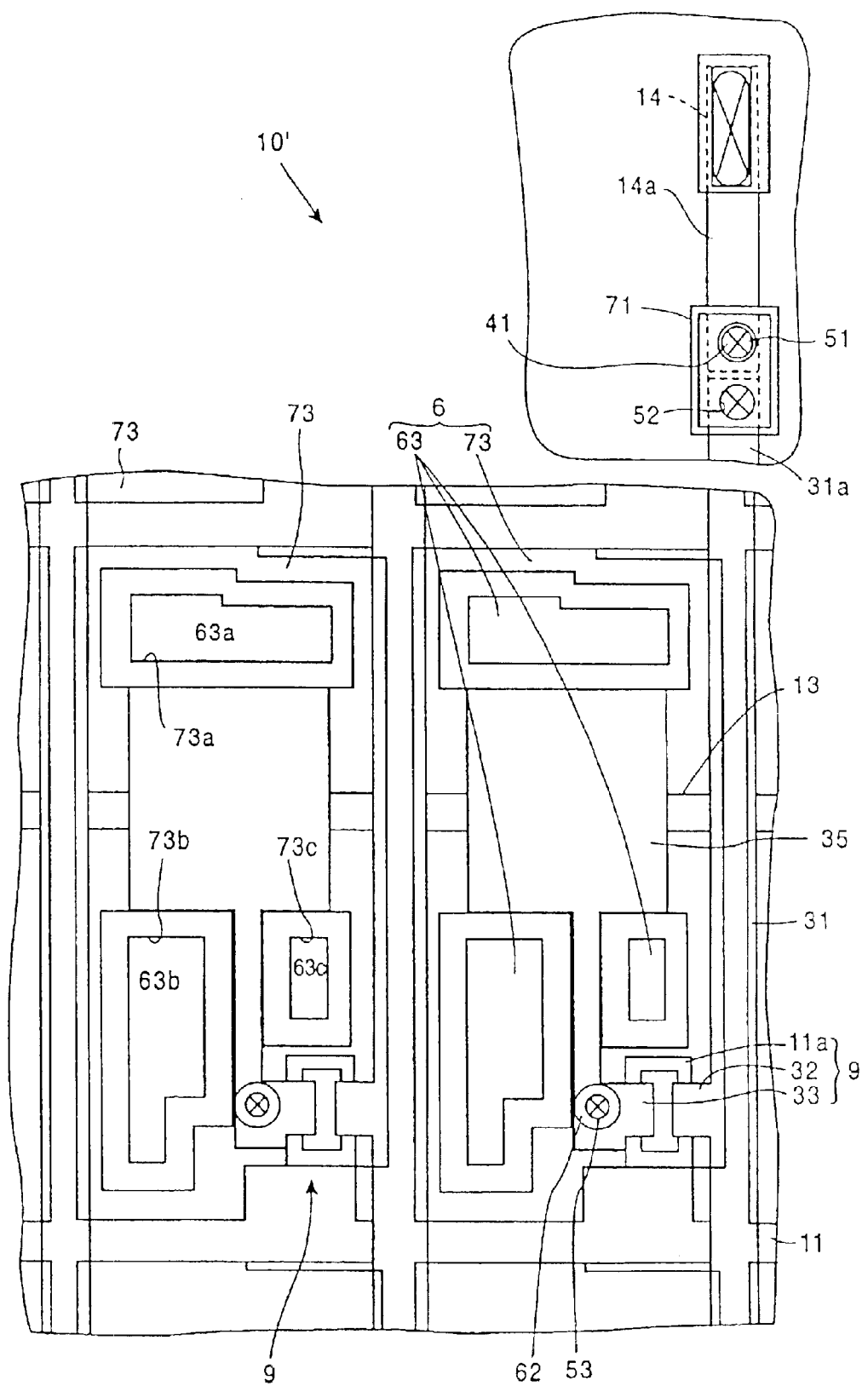
FIG. 12 is a fragmentary plan view of the TFT array substrate of the present invention (second embodiment)
Figure 13:
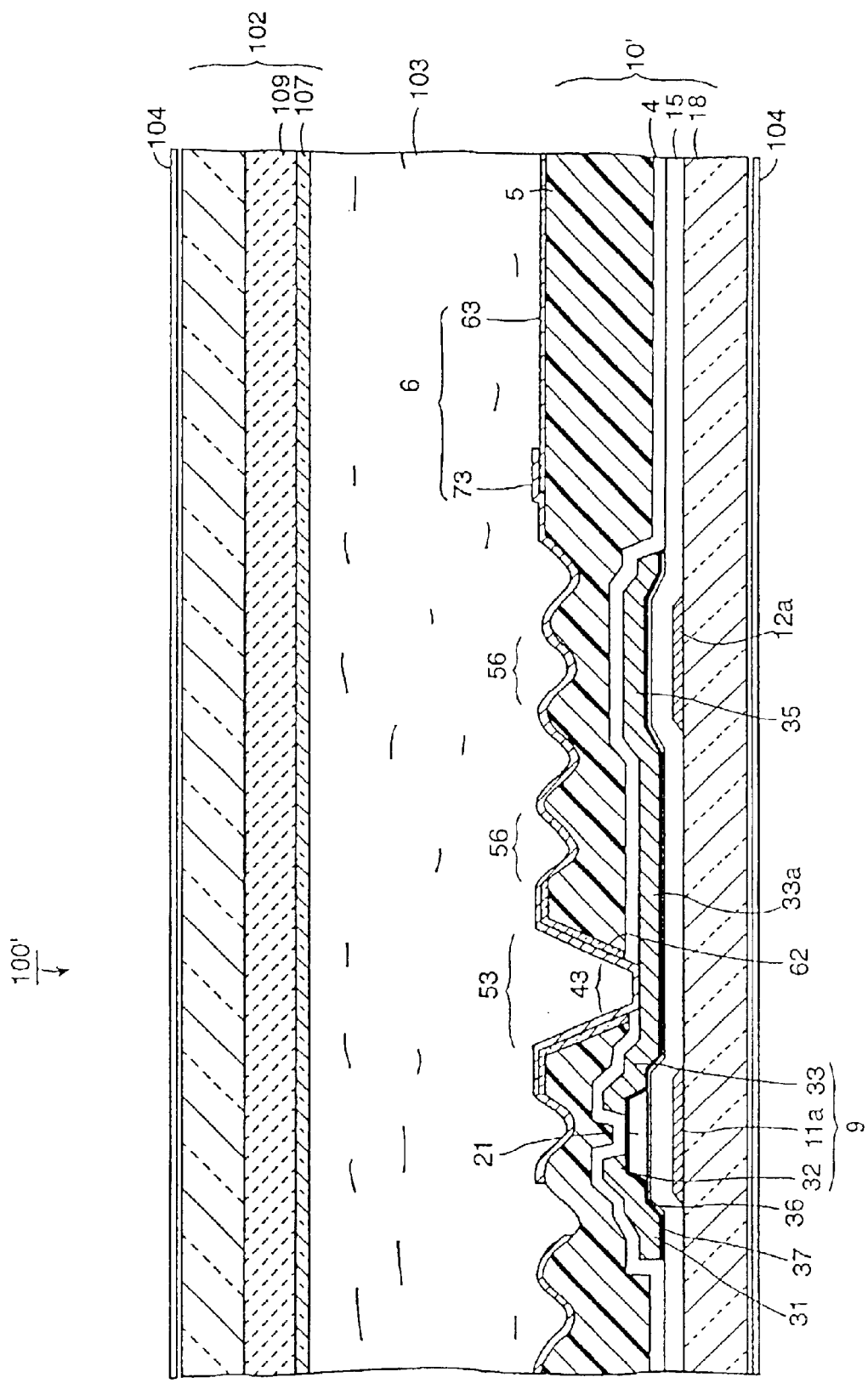
FIG. 13 schematically shows a sectional view of a pixel portion of a display panel of the present invention (second embodiment)
Figure 14:
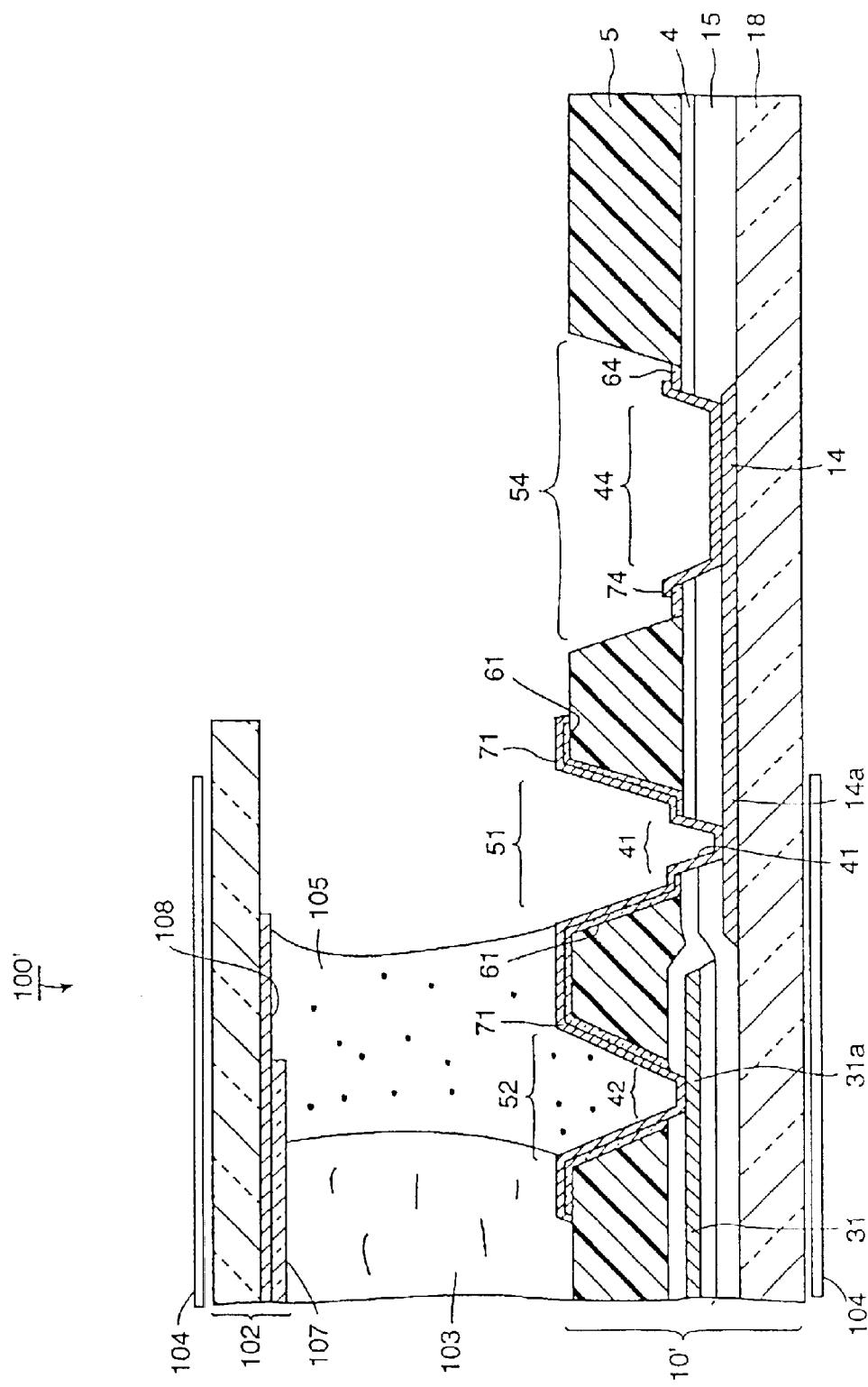
FIG. 14 is a sectional view of a peripheral portion of the display panel of the present invention (second embodiment)

FIGS. 11A, 11B and 11C show schematically sectional views of major components in the TFT array substrate to explain its production steps. FIG. 12 is a schematic plan view of the TFT array substrate 10'. FIGS. 13 and 14 show sectional views of pixels and their peripheral portions in a display panel 100' including the TFT array substrate 10', respectively.

First, the structure of the TFT array substrate 10' will be explained with reference to FIGS. 12, 13 and 14. As shown in FIGS. 12 and 13, although the structure of the TFT array substrate is similar to that of the first embodiment described above, the pixel portion includes additionally an interlayer insulation film 4 formed under the optically transparent thick insulation resin film 5 (i.e., the interlayer insulation film 4 is inserted between the optically transparent thick insulation resin film 5 and the gate insulation film 15), the source electrode 33 of the thin film transistor 9 is electrically connected to the pixel electrode 6 through the lower and upper contact holes 43 and 53 perforated through the interlayer insulation and optically transparent thick resin insulation films 4 and 5. The lower and upper contact holes 43 and 53 are coated with a perforated doughnut-like ITO film 62.

In the peripheral portion of the TFT array substrate 10' similar in structure to that of the first embodiment described above, as shown in FIGS. 12 and 14, the end portion 31a of the signal line 31 is connected to the conductive lines 14a extending from the connecting pad 14 to the inside of the TFT array substrate 10 through the bridge-like conductive film 71. The bridge-like conductive film 71 is formed at the same time as the pixel electrode to cover the entire surface of the lower and upper contact holes 41, 42, 51 and 52.

Similarly to FIGS. 1A through 1C, FIGS. 11A through 11C show steps of making the lower contact hole 41 on the conductive lines 14*a* located at the end portion of the TFT array substrate 10. The following steps are carried out.

First, a photoresist pattern 8 is formed over the optically transparent thick resin insulation film 5 (the photoresist pattern 8 is formed an ITO film). The photoresist pattern 8 includes an aperture 81 corresponding to the upper contact hole 51 perforated through the optically transparent thick resin insulation film 5 and is slightly smaller in diameter than the upper contact hole 51.

Under the photoresist pattern 8 the following wet-etching steps (1) through (3) are carried out and a manufacturing step (4) is then fulfilled to form the bridge-like electrically conductive film 71.

Figure 17:
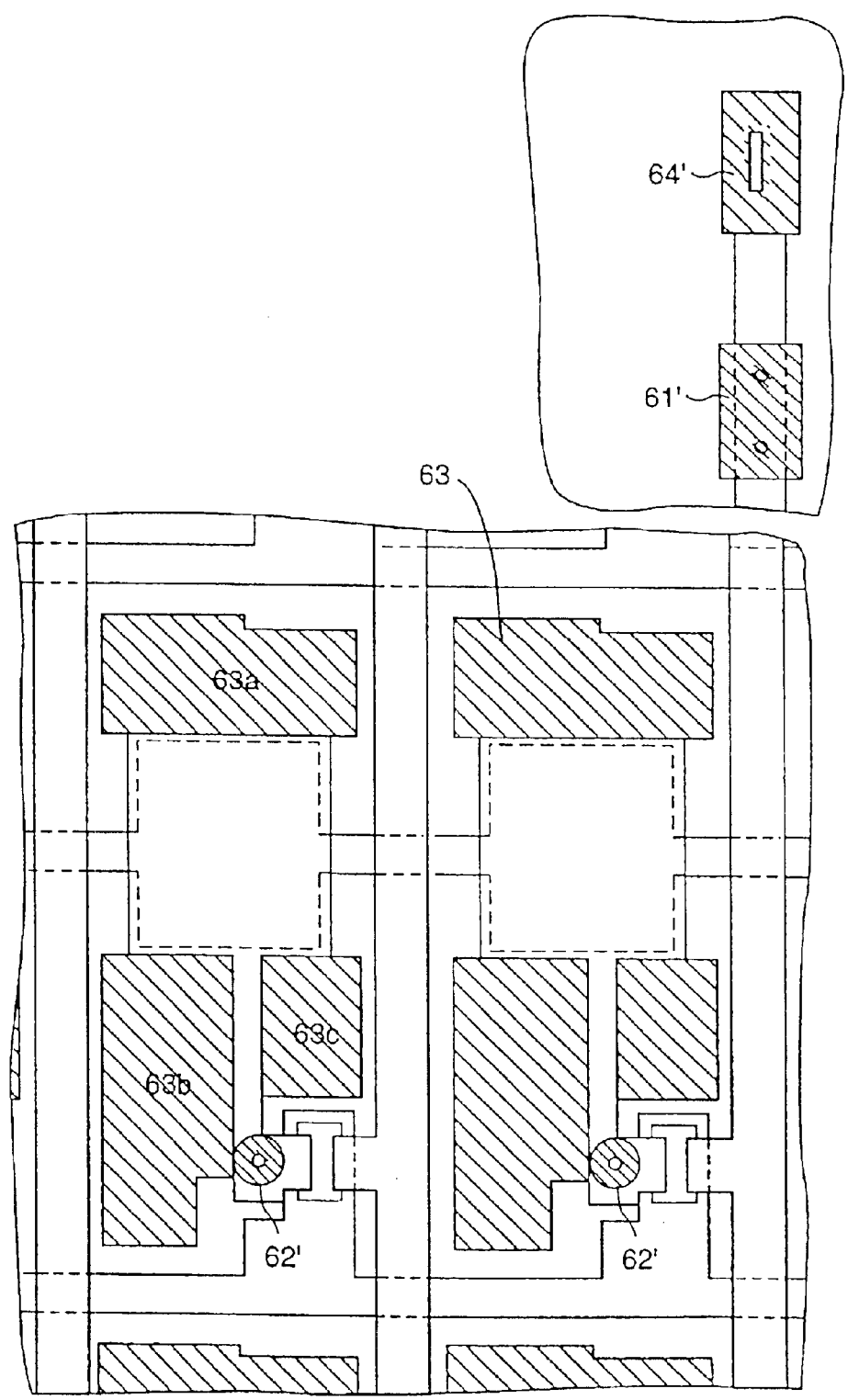
FIG. 17 is a fragmentary plan view of a first etching stage in a fifth patterning step of the TFT array substrate of the present invention (second embodiment)

(1) First Etching Step (ITO Pattern Formation: FIG. 17)

The oxalic acid solution for the wet-etching of the a-ITO film exclusively carries out the patterning along contours of the photoresist pattern 8. The ITO film pattern 61' is formed to cover the upper contact hole 51 and its vicinity. At the same time the optically transparent pixel electrodes 63*a*, 63*b* and 63*c* are made in the pixel area.

(2) Second Etching Step (Perforation of Through Holes: FIG. 11B)

The wet-etching solution fulfils the etching of the interlayer insulation film 4 made of silicon nitride and the gate insulation film 15 made of silicon oxide to make the lower contact hole 41 perforated through the interlayer and gate insulation films 4 and 15. Since this etching causes a significant side etching to make the lower contact hole 41 relatively bigger in diameter than in the case of the aperture 81 of the photoresist pattern 8. Thus, it forms an "eaves" portion 6*a* between lower fringe portion of the aperture 81 and upper fringe portion of the lower contact hole 41.

At the same time, the lower contact hole 43 is made to expose the interlayer and gate insulation films 4 and 15 in the pixel region.

(3) Third Etching Step (ITO Back Etching: FIG. 11C)

The "eaves" portion 6*a* is removed by using the oxalic acid solution again. In this case, the etching solution affects from the back side of the photoresist pattern 8 through the lower contact hole 41, i.e., the back etching is affected.

As a result of a series of those patterning steps, the perforated ITO film patch 61 is formed on the upper contact hole 51 and not on the lower contact hole 41. Then, removal of the photoresist pattern 8, washing of the TFT array substrate, and annealing of the a-ITO film (crystallization by heating) are carried out.

Figure 19:
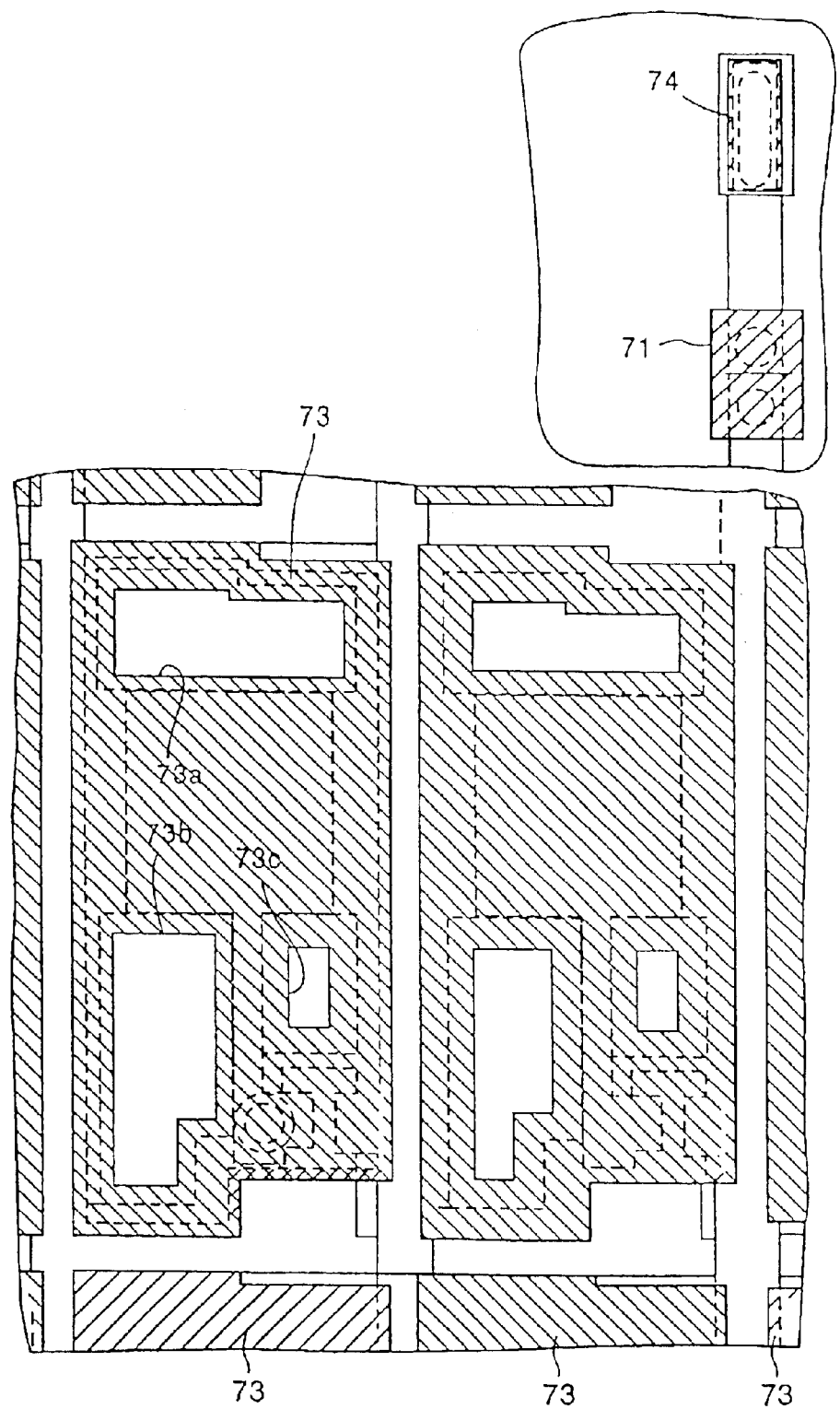
FIG. 19 is a fragmentary plan view of a sixth patterning step of the present invention (second embodiment)

(4) Formation of Top Metal Pattern (FIG. 19)

The steps of coating a photoresist, exposure with a photomask and development are performed after forming molybdenum and aluminum (Mo/Al) heaped films. The bridge-like electrically conductive film 71 is formed by etching to cover the region from the lower contact holes 41 shown in FIG. 11C to the neighboring lower contact hole 42 (FIG. 19). At this time, the reflection type pixel electrode 73 is made in the pixel region.

Next, with reference to FIGS. 15 through 18, production steps of the TFT array substrate 10' are described in detail. Where the TFT array substrate 10' is manufactured, wiring and film forming patterns for the liquid crystal display devices each are made per predetermined size (e.g., 2.2 inches in diagonal length) on a larger size mother TFT array substrate (e.g., 550 mm×650 mm). After that a larger size mother counter substrate similarly prepared is put together with the larger size mother TFT array substrate through spacers by sealant, cell structures each corresponding to the liquid crystal display devices are cut out from it, respectively.

Figure 15:
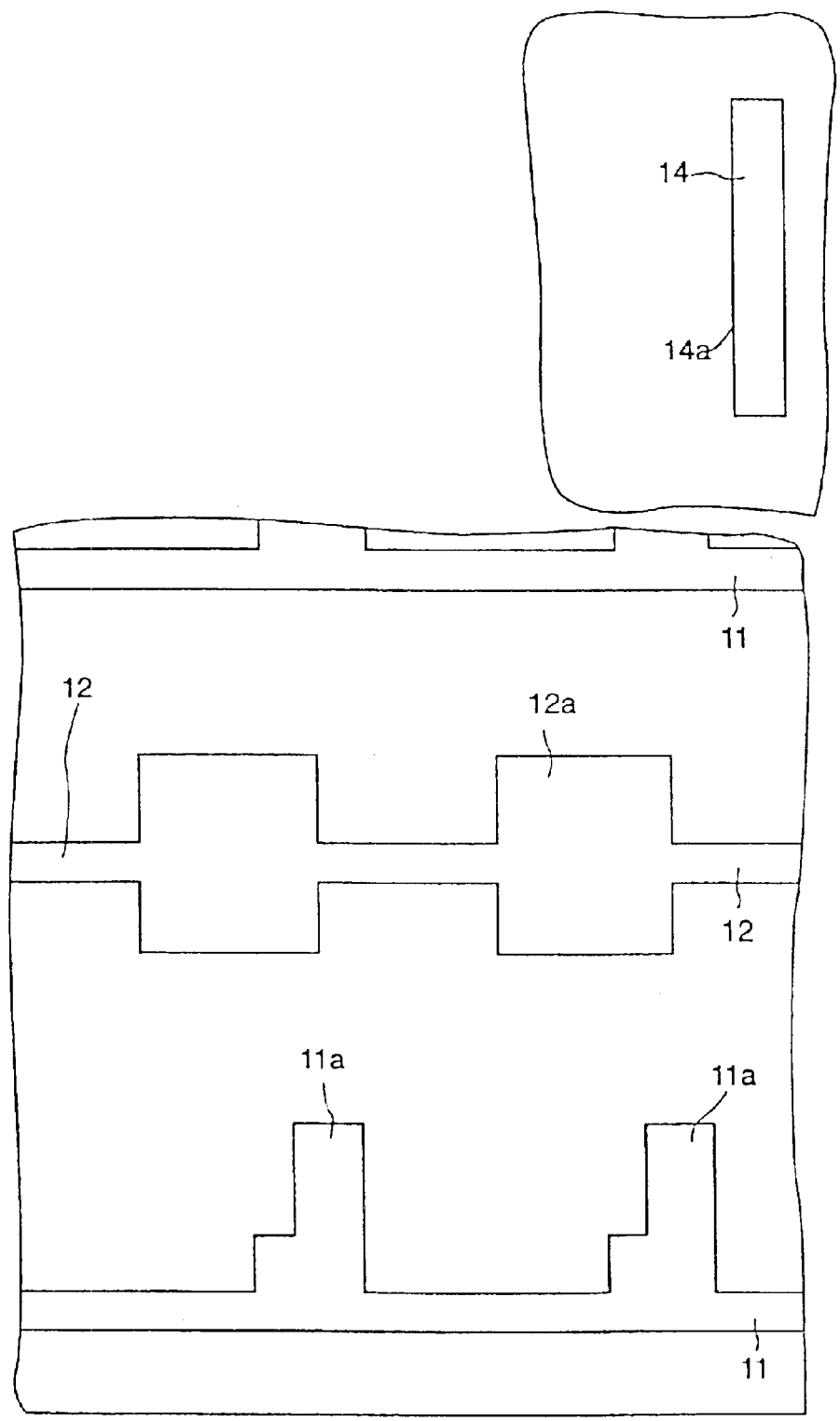
FIG. 15 is a fragmentary plan view of a first patterning step of the TFT array substrate of the present invention (second embodiment)

(1) First Patterning (FIG. 15)

A sputtering method is applied to form a 230 mm thick molybdenum and wolfram (MoW) alloy film on the glass substrate 18. A patterning step using a first photomask forms 176 scanning lines 11, gate electrodes 11*a* extending from the scanning lines, respectively, signal lines 31 and auxiliary electrical capacitor lines (Cs wiring lines) 12 with the same number of lines as that of the signal lines 31 per diagonally 2.2-inch (56 mm) long rectangular region. The auxiliary capacitor lines 12 each are disposed approximately in the middle of the neighboring scanning lines 11 and include substantially rectangular and auxiliary capacitor electrodes 12*a* at locations kept away from those in the vicinities of the signal lines 31. At the same time, the connecting pads 14 and connection lines 14*a* extending from the pads 14 are made at the peripheral portions.

Figure 16:
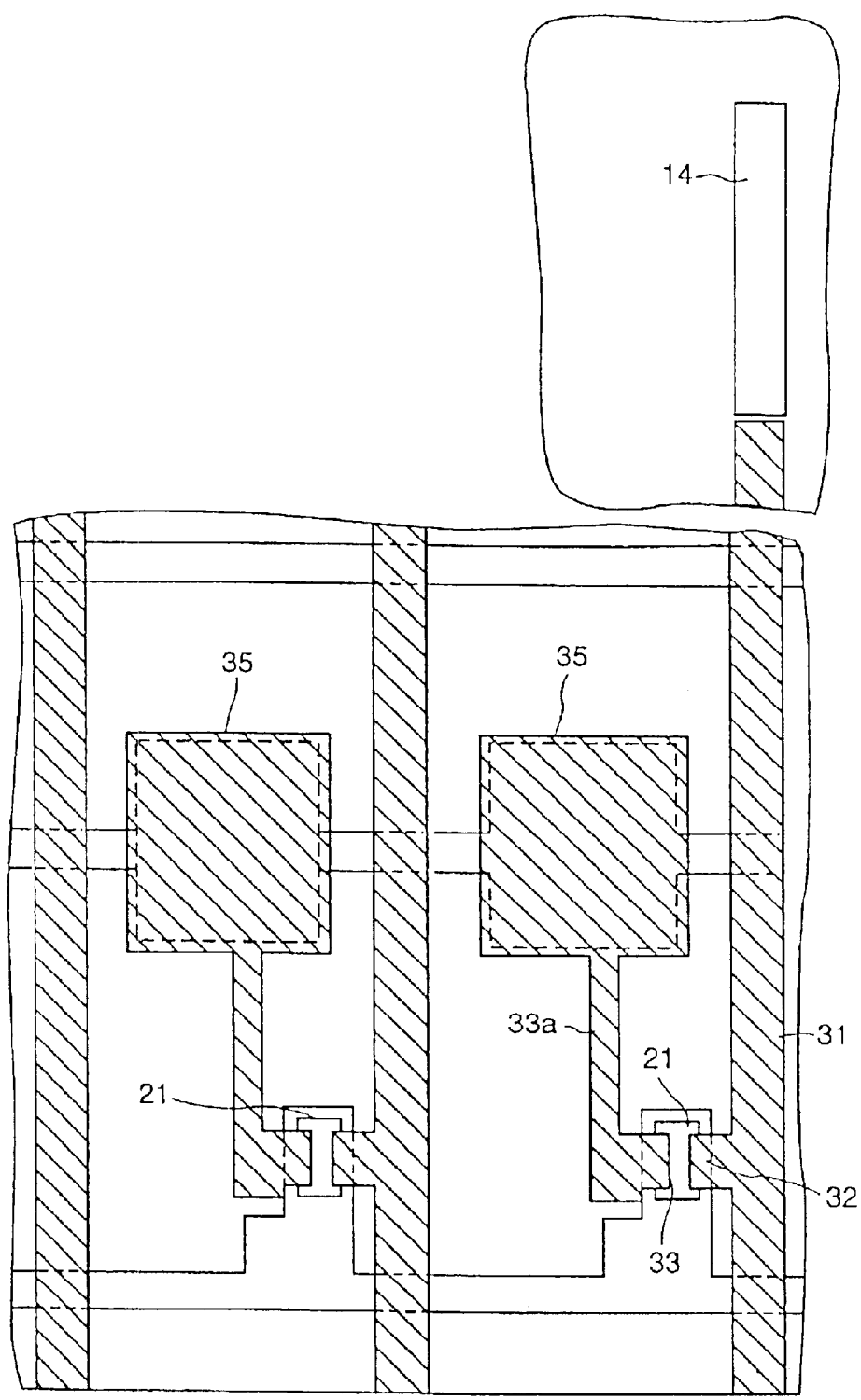
FIG. 16 is a fragmentary plan view of a third patterning step of the TFT array substrate of the present invention (second embodiment)

(2) Second Patterning (FIG. 16)

The gate insulation film 15 made of 350 nm thick silicon oxide nitride (SiONx) is formed on the TFT array substrate. After the surface of the gate insulation film 15 is treated with the oxalic acid solution, a semiconductor layer 36 made of 50 nm amorphous silicon (a-Si:H), a 200 nm thick silicon nitride (SiNx) used for a channel protection film 21, etc. are successively heaped on the gate insulation film 15 without exposing them to the air (see also FIG. 13).

After coating a photoresist, the channel protection film 21 is formed on the gate electrode 11*a* by applying a back exposure process technology making use of patterns of the scanning lines 11 etc. obtained from this first patterning step as masks.

(3) Third Patterning (FIG. 16)

After the exposed surface of the amorphous silicon (a-Si:H) layer is treated with the oxalic acid solution, a chemical vapor deposition (CVD) method similar to the CVD method already set forth above is applied to form a 50 nm thick phosphor doped amorphous silicon ($n^+$a-Si:H) to make a low electric resistance semiconductor layer 37 with a good ohmic contact (see also FIG. 13).

A sputter method is then applied to heap three-metal (Mo/Al/Mo) layers made of 25 nm thick molybdenum (Mo) at the bottom, 250 nm thick aluminum (Al) in the middle and 50 nm thick molybdenum (Mo) at the top. Further, the photoresist is exposed and developed by using a third photomask, and the a-Si:H layer, $n^+$a-Si:H layer and Mo/Al/Mo layers are collectively subjected to patterning. This third patterning makes 220×3 signal lines 31, drain electrodes 32 extending from the signal lines 31 and source electrodes 33 per diagonally 2.2-inches (56 mm) long rectangular region.

At the same time, auxiliary capacitor electrodes (Cs patterns) are provided to overlap and to be slightly bigger in size around their periphery than the auxiliary capacitor electrode 12*a* of the auxiliary capacitor lines 12. The auxiliary capacitor electrodes 35 are rectangular patterns further extending from straight lines 33*a* disposed along the signal lines 31 extending from the source electrodes 33.

(4) Fourth Patterning

A 50 nm thick interlayer insulation film 4 made of silicon nitride is formed on the multi-layer pattern formed in the steps so far.

A positive photosensitive resin liquid is then uniformly coated on the multi-layer patterns made by the patterning steps set forth above in order for the resin to become 2 μm in thickness in a solid state. After that, as will be explained below, the steps of exposure, development, irradiation of ultraviolet rays, post baking and washing are sequentially carried out. The irradiation of ultraviolet accelerates chemical reactions in the optically transparent thick resin insulation film 5 to improve its optical transparency.

Strong exposures are carried out for the upper contact holes 51, 52 and 53 and bare regions 54 used for the connecting pads but weak exposures are carried out for concaves in the reflective pixel electrode regions (see FIGS. 12 and 13).

As explained in the first embodiment, the positively photosensitive thick resin insulation film may be made of a negatively photosensitive resin and the different accumulated exposure quantities may be also achieved by a half tone patterning using a photomask with mesh patterns provided in predetermined regions instead of the two photomasks as described above.

(5) Fifth Patterning (FIGS. 11A–11C, 17 and 18)

A 40 nm thick a-ITO film is formed on the optically transparent thick resin insulation film 5 as a transparent electrically conductive film layer. Subsequently, the a-ITO film is subjected to photoresist coating, exposure and development. Under the photoresist pattern 8, the following three-step etching operations are carried out. The photoresist pattern 8 has three apertures 81 corresponding to the upper contact holes 51, 52 and 53. The diameter of the aperture 81 is slightly smaller than the inner diameter of the corresponding upper contact hole 51, 52 or 53 (specifically, the aperture diameters at the bottom).

(5-1) Formation of ITO Pattern (FIG. 17)

A wet etching with the oxide acid solution for 50 minute at 45° C. removes the a-ITO film entirely except those covered by the photoresist pattern 8. Namely, the etching makes an a-ITO film pattern in accordance with the photoresist pattern 8. Thus, the optically transparent pixel electrode 63 consisting of three rectangular patterns of the optical transparent pixel electrodes 63a, 63b and 63c is made per pixel dot. An ITO film pattern 61' with a small hole is provided to cover the upper contact hole 53 except the central portion at the source electrode 33.

At the same time, the perforated ITO film patch 61 is formed to cover the surfaces of the upper contact holes 51 and 52 at the periphery portion of the TFT array substrate 10' and a pad covering ITO pattern 64' to cover the connecting pad 14 except a line-like portion of the connecting pad 14 at its center region.

(5-2) Formation of Through Holes (FIG. 1A)

Next, an etching solution of BHF (hydrofluoric acid-ammonium fluoride buffer solution) is sprayed to necessary portions for a period of 120 sec. at a temperature of 28° C., for example. The etching solution removes the interlayer and gate insulation films 4 and 15 or the interlayer insulation film 4 at the bottom region of the upper contact holes 51, 52 and 53 to expose the lower metal layer. The buffered hydrofluoric acid solution includes, for instance, 6% hydrofluoric acid and 30% ammonium fluoride. The etching time is determined to avoid excessive side-etching and to make the inner wall slope of the lower contact holes 41, 42 and 43 at an angle of about 45°.

As shown in FIG. 11A, the gate insulation film 15 and the interlayer insulation film 4 are removed at the same time in bottom contour portions of the upper contact hole 51 at the end portion of the connecting line 14a extending from the connecting pad 14 to the inside of the TFT array substrate 10. Thus, the lower contact hole 41 is perforated through the interlayer and gate insulation films 4 and 15 to expose the inner end portion of the line 14a.

The interlayer insulation film 4 is removed at the inside of the upper contact hole 52 at the end portion of the neighboring signal lines so that the lower contact hole 42 is provided to expose the end portion 31a of the signal line 31. At the same time, the lower contact hole 43 is perforated through the interlayer insulation film 4 to expose the source electrode 33.

As also shown in FIG. 11A, the wet etching to make through-holes causes, more or less, the side-etching at the interlayer and gate insulation films 4 and 15. Thus, the inner diameter "D" (at the bottom) of the aperture 81 of the photoresist pattern 8 is smaller than the inner diameter "D2" at the bottom of the contact hole 51, 52 or 53 by the size "d" of the side etching at both sides plus a slight margin (tolerance) "m", i.e., D=D2−2(d+m). The margin "m" is about 2 μm in this embodiment.

Inconsideration of some dispersions of the side-etching conditions, the margin "m" is set up, the upper edge of the lower contact hole 41, 42 or 43 perforated through the interlayer and gate insulation films 4 and 15 is designed to be necessarily an inner side from the corresponding lower diameter of the upper contact hole 51, 52 or 53 perforated through the thick resin insulation film 5. Even where an overhanging or step portion is formed on the electrically conductive film to cover the walls of the contact holes, the electric discontinuity is prevented from taking place at such a step portion.

The side etching speed in the case of hydrofluoric acid system solution such as buffered hydrofluoric acid etc. is generally faster in the interlayer insulation film 14 made of silicon nitride than that in the gate insulation film 15. As a result, it is rather easy to make the inner wall of the contact hole 41 a gentle taper-like structure.

Figure 18:
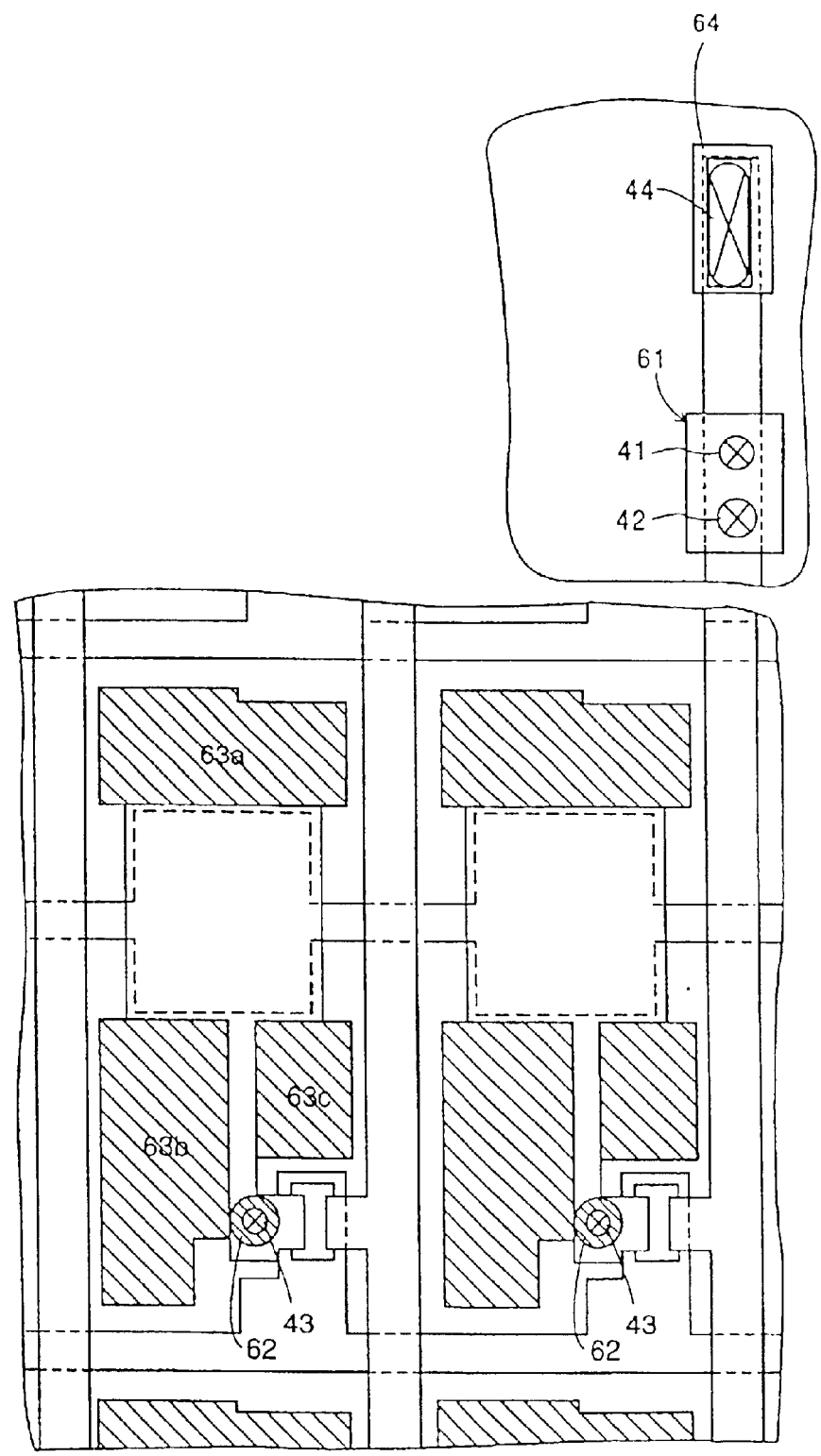
FIG. 18 is a fragmentary plan view of completion of the fifth patterning step of the present invention (second embodiment)

(5-3) Back-etching of a-ITO Film (FIGS. 11B and 18)

The oxide acid etching solution is used for a period of 15 sec. at a temperature of 45° C., for instance, to remove the "eaves" portion of the a-ITO film resulting from the side-etching of the interlayer and gate insulation films 4 and 15. As schematically shown in FIG. 11B, the etching solution reaches the back of the photoresist pattern 8, i.e., the "back-etching" is carried out. After completion of this back-etching, the photoresist pattern 8 is removed and the a-ITO film is washed out and annealed for crystallization.

Meanwhile, after the back-etching, the a-ITO film remains to cover the upper contact holes and a step is made at a joint portion of the upper and lower contact holes 51 and 41. Further, exposure portions of the lower contact holes 41, 42 and 43 are removed from ITO film pattern 61' and 62' so that perforated ITO film patch 61 with two holes is made at the peripheral portion of the TFT array substrate and doughnut-like one hole ITO film patch 62 is formed on the source electrode 33. The perforated ITO film patch 64 is provided to surround the exposure portion of the connecting pad 14.

(6) Sixth Patterning (FIGS. 11C and 19)

A sputter method is applied to form double layers of 50 nm thick molybdenum (Mo) and 50 nm thick aluminum (Al), i.e., Mo/Al double layers. A photoresist pattern is then made by using a photomask. Further, a wet etching patterning step makes the bridge-like electrically conductive film 71 covering a pair of neighboring lower contact holes 41 and 42, the pad covering portion 74, and the reflection type pixel electrode 73 covering a major part of each pixel dot.

The reflection type pixel electrode 73 includes the window-like apertures 73a, 73b and 73c configured to expose the pixel electrodes 63a, 63b and 63c except their peripheral portions in each pixel dot, respectively. Thus, the reflection type pixel electrode 73 is overlapped with, and electrically connected to, the transparent pixel electrodes 63a, 63b and 63c at their peripheral portions.

The reflection type pixel electrode 73 covers the thin film transistor 9 and is directly connected to the source electrode 33 of the thin film transistor 9 through contact hole 43 and 53. The reflection type pixel electrode 73 is overlapped with portions extending from and along the signal lines 31 through the thick resin insulation film 5. Thus, the steps described above complete to make a plurality of the TFT array substrates 10' on the large mother substrate.

The counter substrates 102 incorporated with the TFT array substrates and the display panel 100' are formed by carrying out the same steps as in the first embodiment.

Figure 20A:
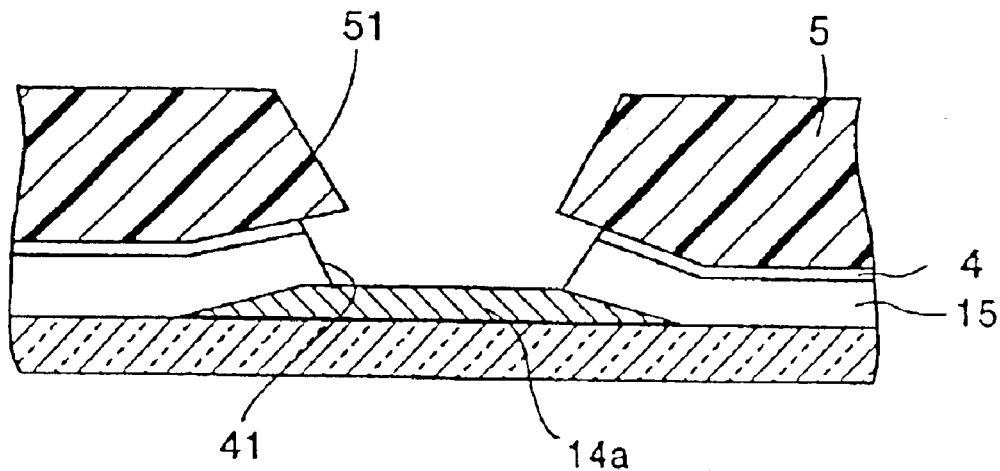
FIGS. 20A and 20B schematically show sectional views of a TFT array substrate to explain manufacturing steps of a second comparison example.
Figure 20B:
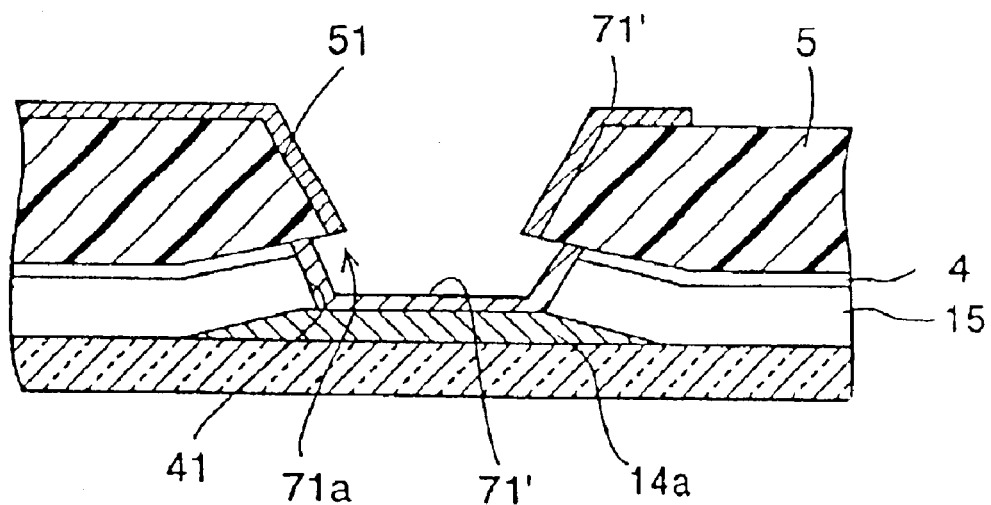

Second Comparison Example (FIGS. 20A and 20B)

Next, a method of making a second comparison example will be explained with reference to FIGS. 20A and 20B.

In this method, the patterning of an interlayer insulation film 4 and a gate insulation film 15 is carried out by using a pattern of a thick resin insulation film 5 as a photomask. As in the first embodiment of the present invention, the BHF_solution is used to etch the silicon nitride film and the silicon oxide film or silicon oxide nitride film at the same time.

As a result, the lower end portion of the upper contact hole 51 projects much closer into the inside than the upper end portion of the lower contact hole 41 due to the side-etching and an overhanging portion is formed on the entire surrounding portion of the lower contact hole 41 as shown in FIG. 20A. Thus, where a metal film 71' is coated on the upper and lower contact holes 51 and 41, the "discontinuity" 71a of the metal film 71' is made between them.

Figure 21A:
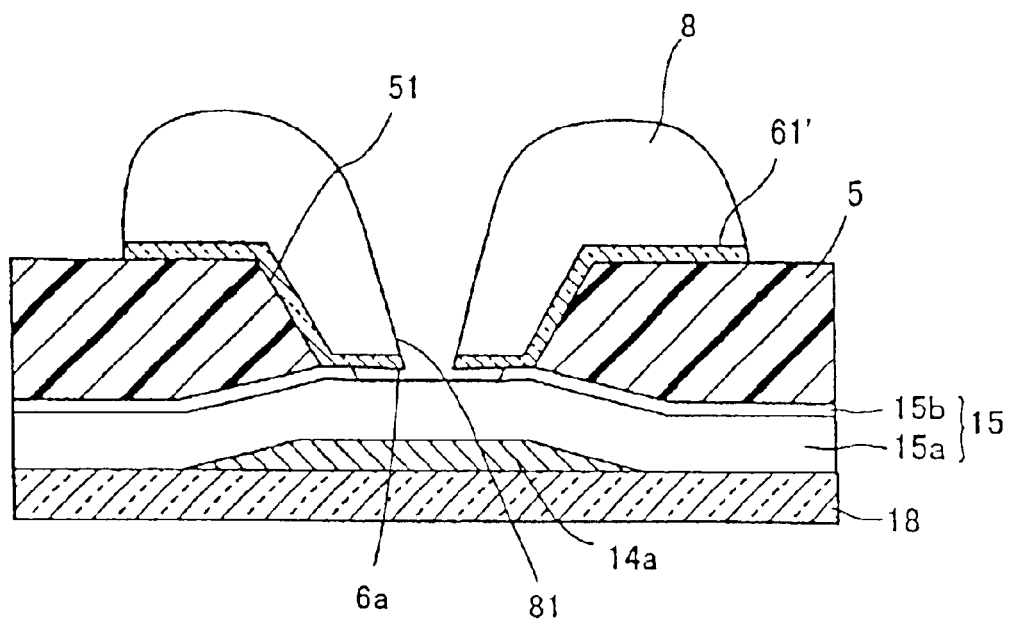
FIGS. 21A and 21B schematically show sectional views of components to explain manufacturing steps of the present invention (third embodiment)
Figure 21B:
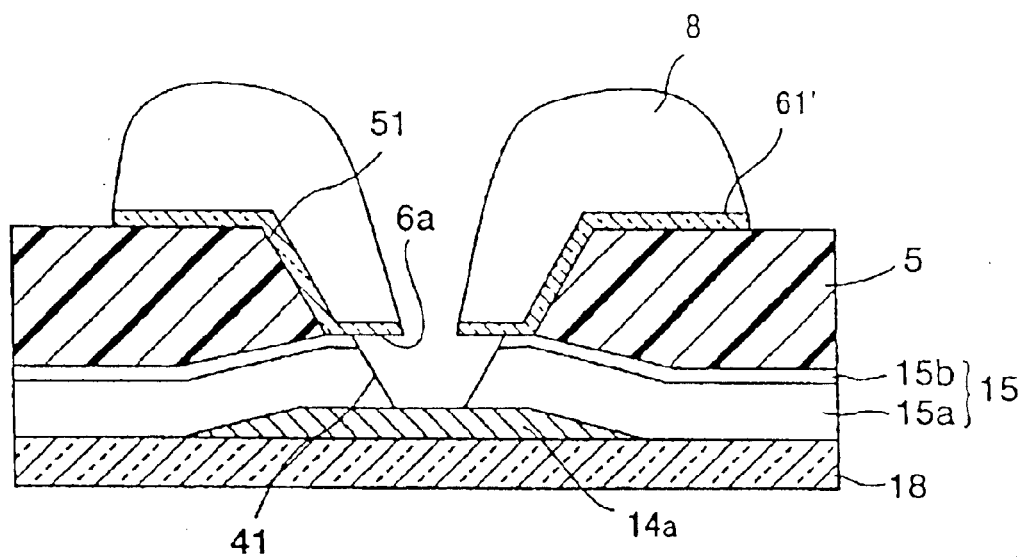
Figure 22A:
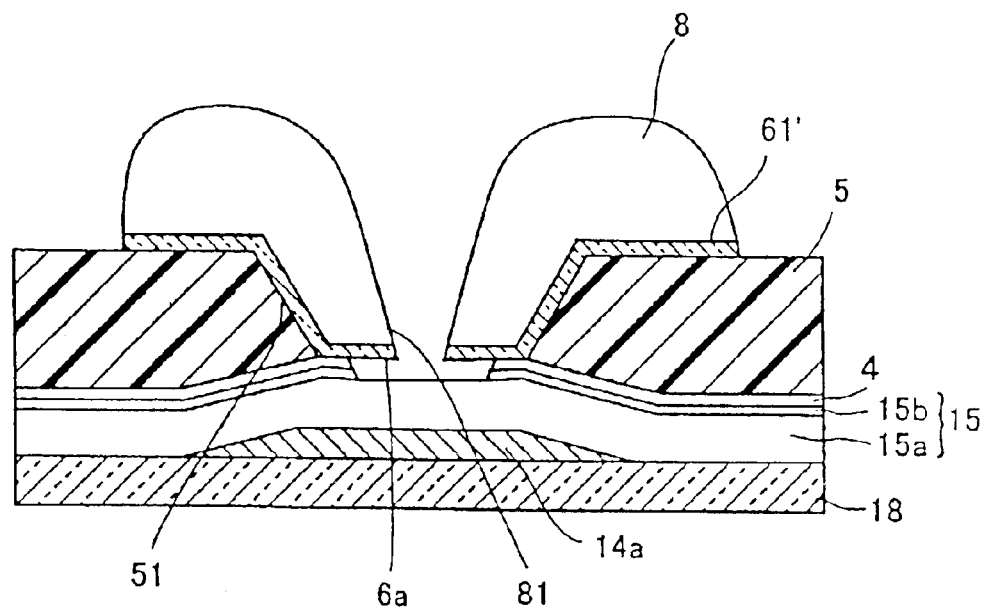
FIGS. 22A and 22B schematically show sectional views of components to explain manufacturing steps of the present invention (fourth embodiment)
Figure 22B:
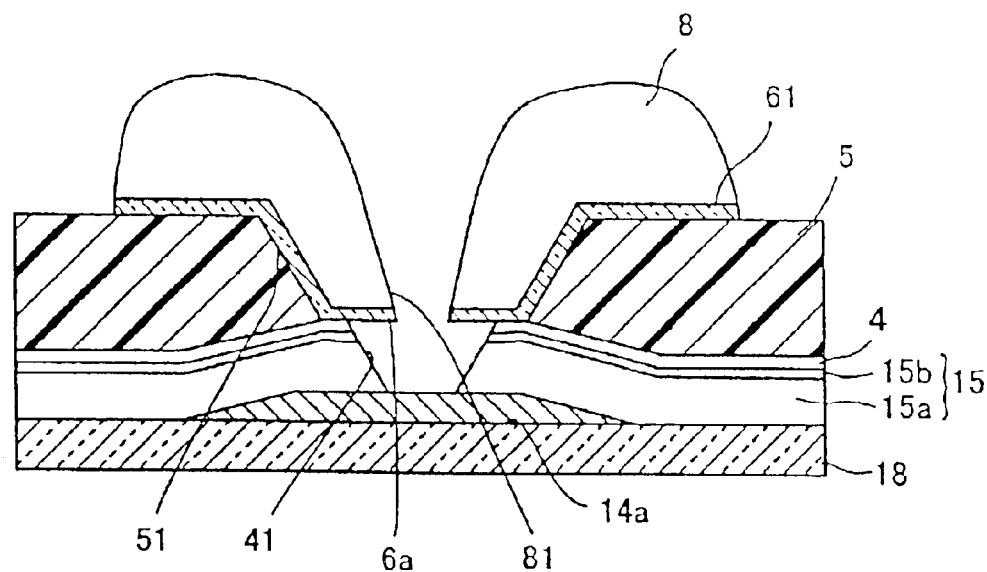

Third and Fourth Embodiments (FIGS. 21 and 22)

Third and fourth embodiments of the present invention will be explained below with reference to FIGS. 21 and 22. Those embodiments use substantially the same method of making a TFT array substrate as the first and second embodiment, respectively, except that they apply a combination of dry and wet etching steps to the upper contact hole 51 to expose the root portion of the connecting line 14a extending from the connecting pad 14.

In detail, the following two steps are substituted for the second etching step of the fifth patterning in the first and second embodiments.

(i) Removal of Silicon Nitride by Dry Etching (FIG. 21A)

First, the second gate insulation film 15b made of silicon nitride is removed by applying a chemical dry etching (CDE) method in the third embodiment. The interlayer insulation film 4, however, is removed by the same step in the fourth embodiment corresponding to the second embodiment. Such a chemical dry etching method is carried out in an etching chamber at a chamber temperature of 60° C. at a chamber pressure of 45 Pa with continuous supply of oxygen ($O_2$) gas at a speed of 330 sccm and tetrafluoro carbon ($CF_4$) gas at a speed of 670 sccm. An electrical power of 600 W is applied for a period of 45 sec.

(ii) Removal of Silicon Oxide by Wet Etching (FIG. 21B)

Next, the BHF solution removes the gate insulation film 15a made of silicon oxide. The BHF solution includes 6% hydrofluoride and 30% aluminum fluoride, for instance and is sprayed to the film at a temperature of 28° C. for a period of 70 sec.

The side etching in the case of wet etching is generally more than that in the case of dry etching. As shown in FIG. 21B, the silicon nitride film (second gate insulation film 15b) is subjected to the side etching. As a result, the inner wall of the lower contact hole 41 becomes a gentle taper-like structure.

Figure 23A:
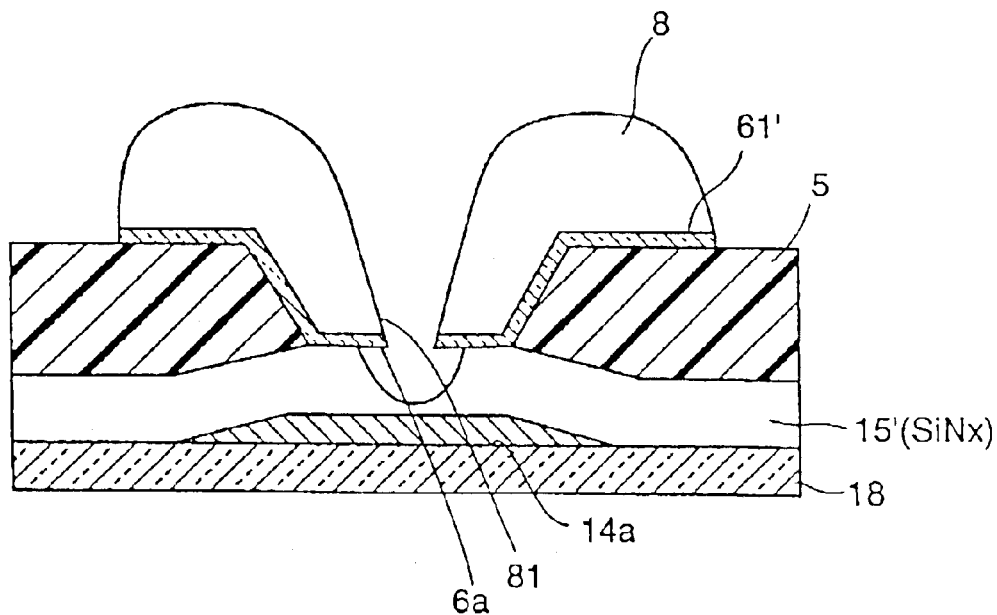
FIGS. 23A and 23B schematically show sectional views of components to explain manufacturing steps of the present invention (fifth embodiment)
Figure 23B:
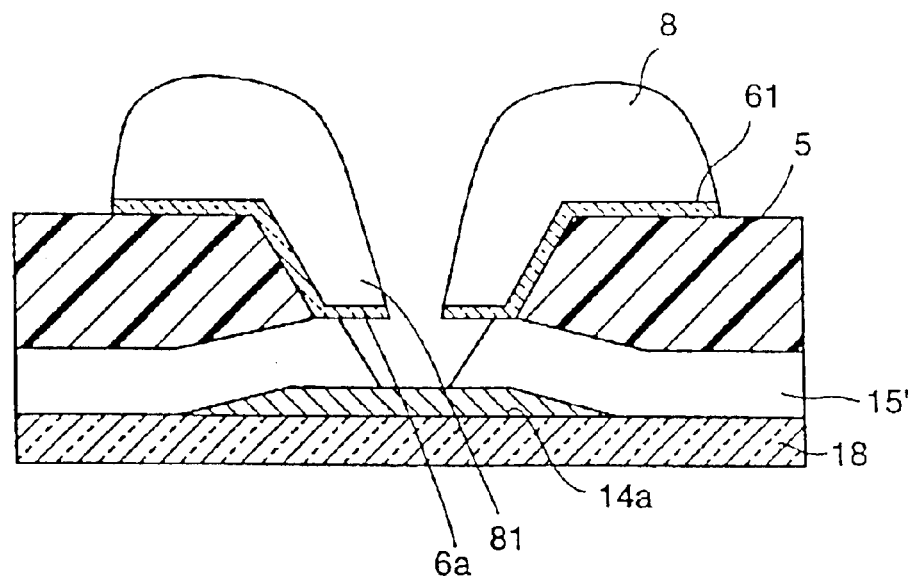
Figure 24A:
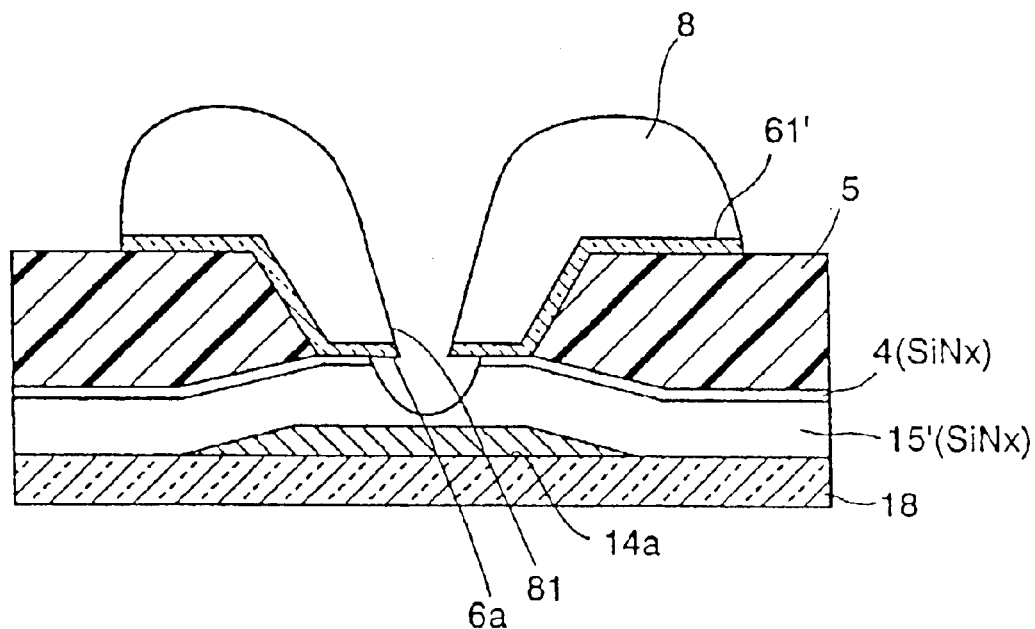
FIGS. 24A and 24B schematically show sectional views of components to explain manufacturing steps of the present invention (sixth embodiment)
Figure 24B:
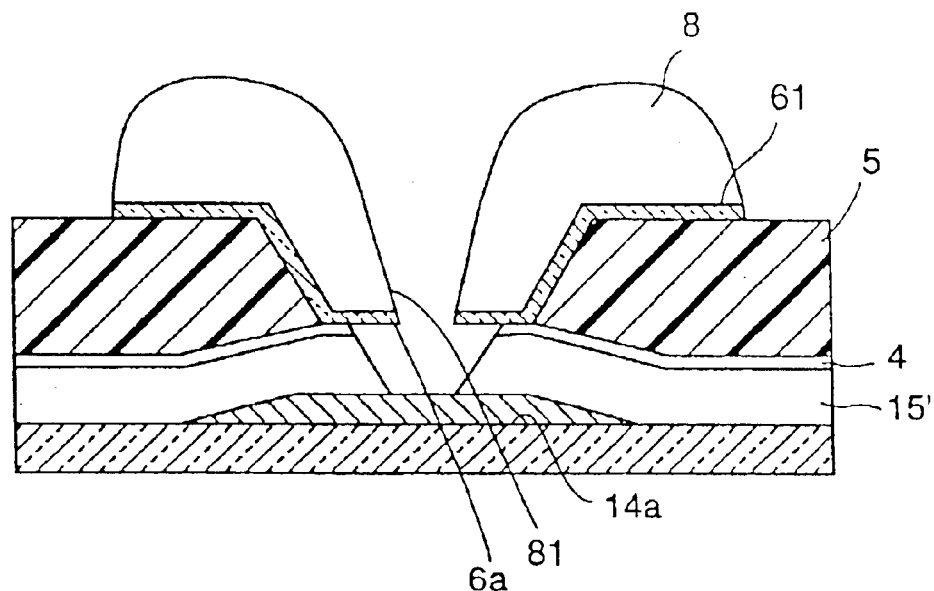

Fifth and Sixth Embodiments (FIGS. 23 and 24)

Fifth and sixth embodiments of the present invention will be explained below with reference to FIGS. 23 and 24. Those embodiments use substantially the same method of making a TFT array substrate as the first and second embodiment, respectively, except that they form the gate insulation film 15 made of an only single silicon nitride film.

An entire step of removal of the gate insulation film 15 to make the lower contact hole 41 is carried out by only applying a dry etching method (See also FIGS. 23A, 23B, 24A and 24B).

The side etching in the case of dry etching is generally less than that in the case of dry etching but still occurs more or less. The methods of manufacturing the TFT array substrate in the fifth and sixth embodiments, however, can prevent electrical discontinuity due to such side etching.

For the sake of simplicity, the following describes the steps different from the first or second embodiment. In the second patterning step, a single insulation gate film 15' made of about 300 nm thick is formed. After hydrofluoric acid treatment of the surface, a 50 nm thick amorphous silicon film (a-Si:H) for the semiconductor layer 36 and a 200 nm thick channel protection film made of silicon nitride (SiNx) of the thin film transistor 9, etc. are subsequently formed without exposing them to the air.

The second etching in the fifth patterning is carried out by applying the chemical dry etching (CDE) only. In detail, Such chemical dry etching is carried out in an etching chamber at a chamber temperature of 60° C. at a chamber pressure maintained 45 Pa with continuous supply of oxygen ($O_2$) gas at a speed of 330 sccm and tetrafluoride carbon ($CF_4$) gas at a speed of 670 sccm and electrical power of 600 W is applied for a period of 60 sec.

Figure 25:
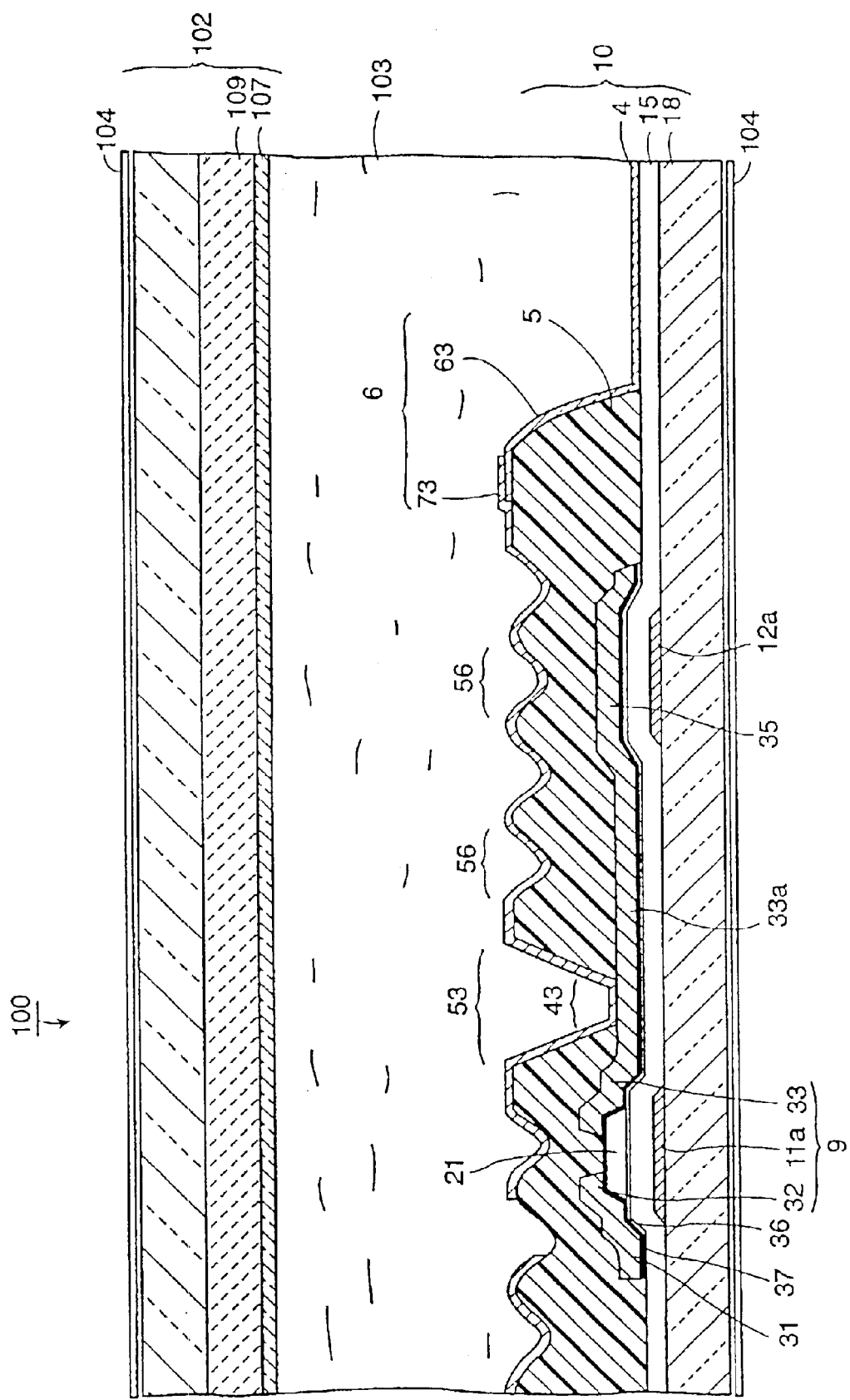
FIG. 25 is a sectional view of a pixel portion of a display panel of the present invention (seventh embodiment)
Figure 26:
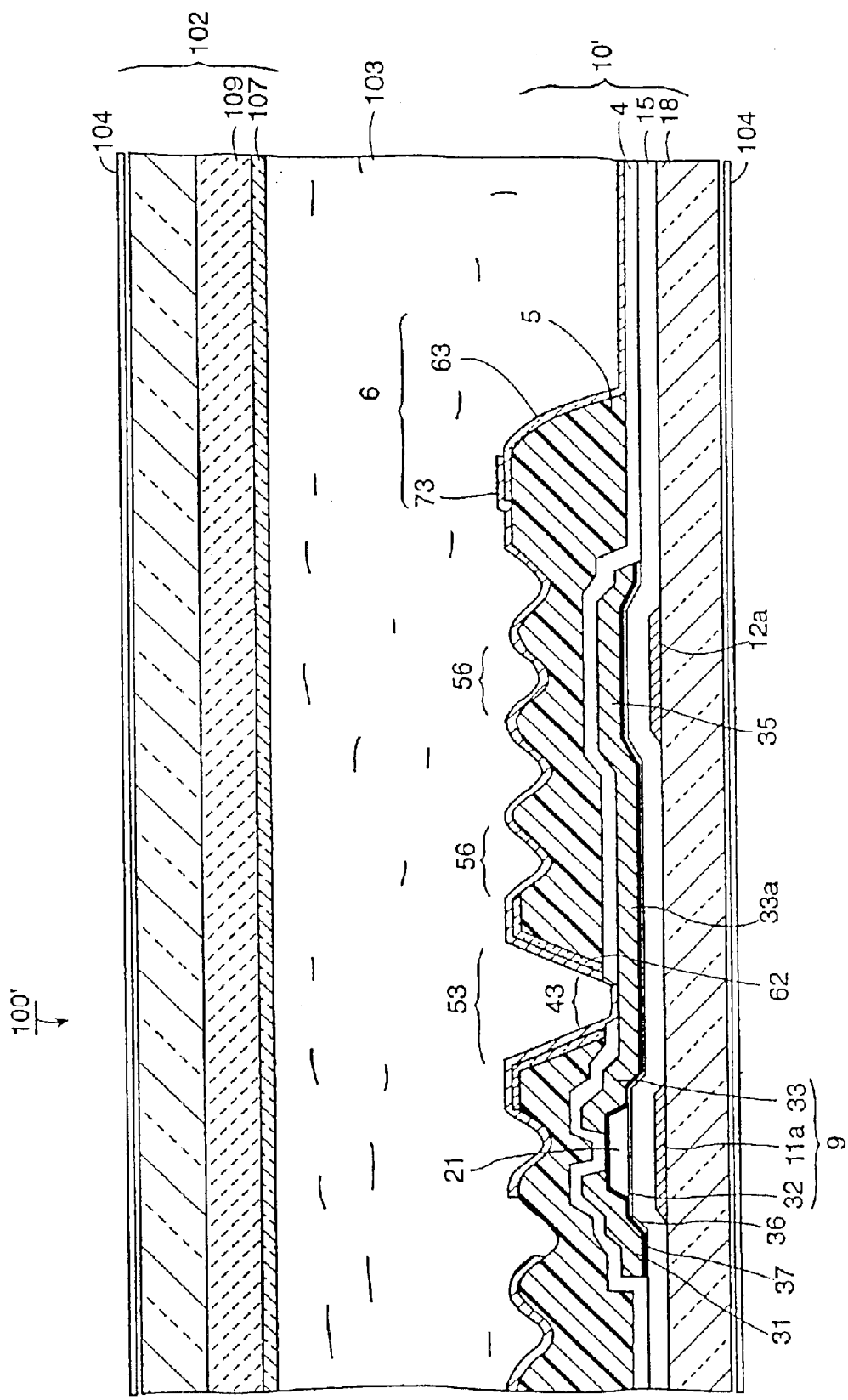
FIG. 26 is a sectional view of a pixel portion of a display panel of the present invention (eighth embodiment)

Seventh and Eighth Embodiments (FIGS. 25 and 26)

Methods of making the TFT array substrate in accordance with seventh and eight embodiments are the same as in the first and second ones except that the thick resin insulation film 5 at the optically transparent pixel electrode 63 is omitted, respectively. FIGS. 25 and 26 show sectional views of the pixel portions of the seventh and eighth embodiments corresponding to the first and second ones, respectively.

Such omission of the thick resin insulation film 5 at the optically transparent pixel electrode 63 can avoid loss caused by light passing through it. In other words, the light from the rear light source can be utilized effectively.

Figure 27:
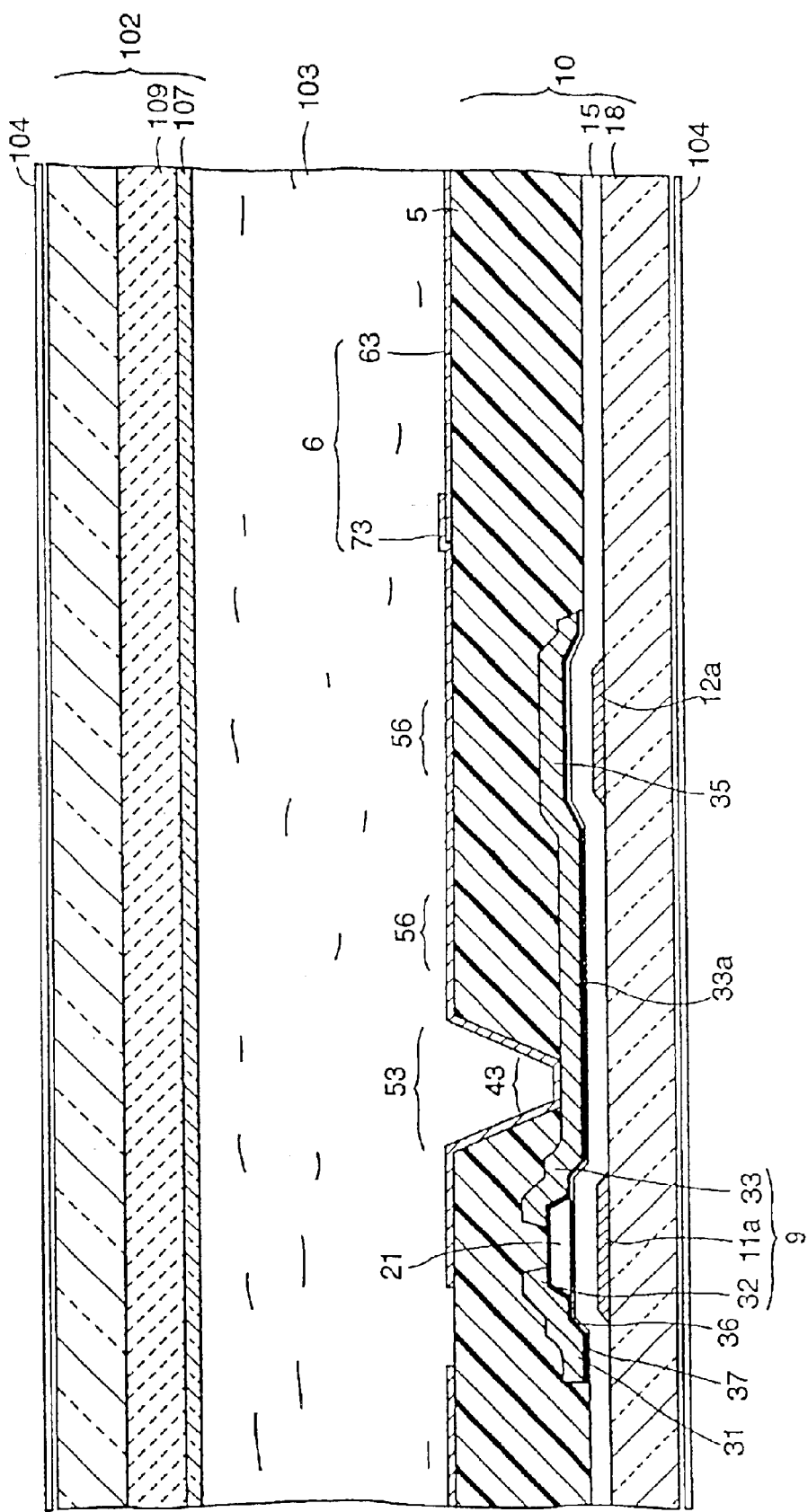
FIG. 27 is a sectional view of a pixel portion of a display panel of the present invention (ninth embodiment)
Figure 28:
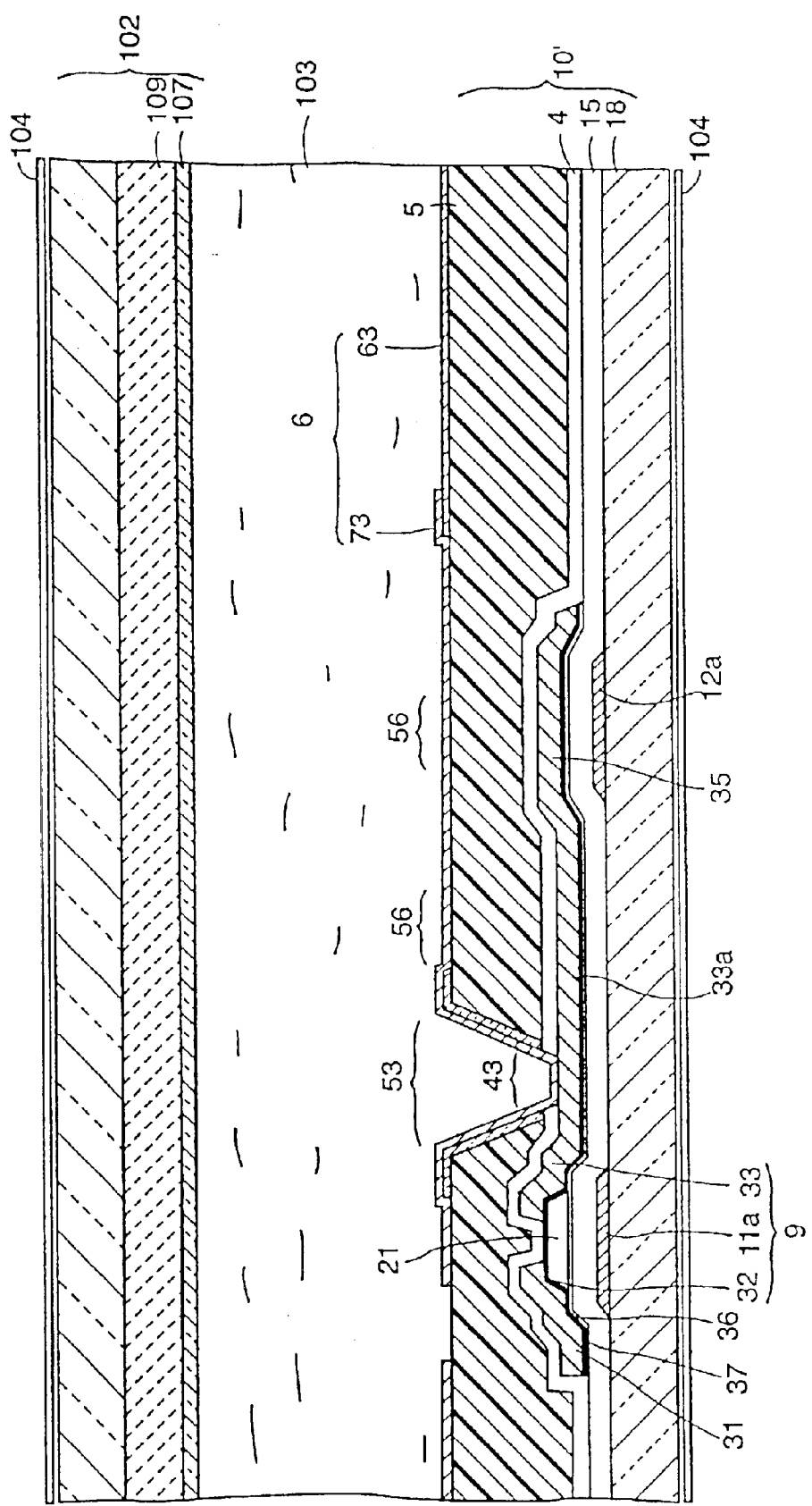
FIG. 28 is a sectional view of a pixel portion of a display panel of the present invention (tenth embodiment)

Nineth and Tenth Embodiments (FIGS. 27 and 28)

Methods of making the TFT array substrate in accordance with seventh and eight embodiments are the same as in the first and second ones except that the concave portions 56 of the thick resin insulation film 5 at the reflection type pixel electrode 73 is omitted, respectively. Thus, the reflection type pixel electrode 73 does not have the uneven portions but is a flat pattern.

FIGS. 27 and 28 show sectional views of the pixel portions of the ninth and tenth embodiments corresponding to the first and second ones, respectively. The peripheral portions of the TFT array substrates in the ninth and tenth embodiments are, however, exactly the same in structure as in the first and second ones.

Their methods of manufacturing the TFT array substrates are exactly the same as those of the first and second embodiments except for not carrying out the concave portions 56 in the fourth patterning step of the ninth and tenth embodiments.

Figure 29:
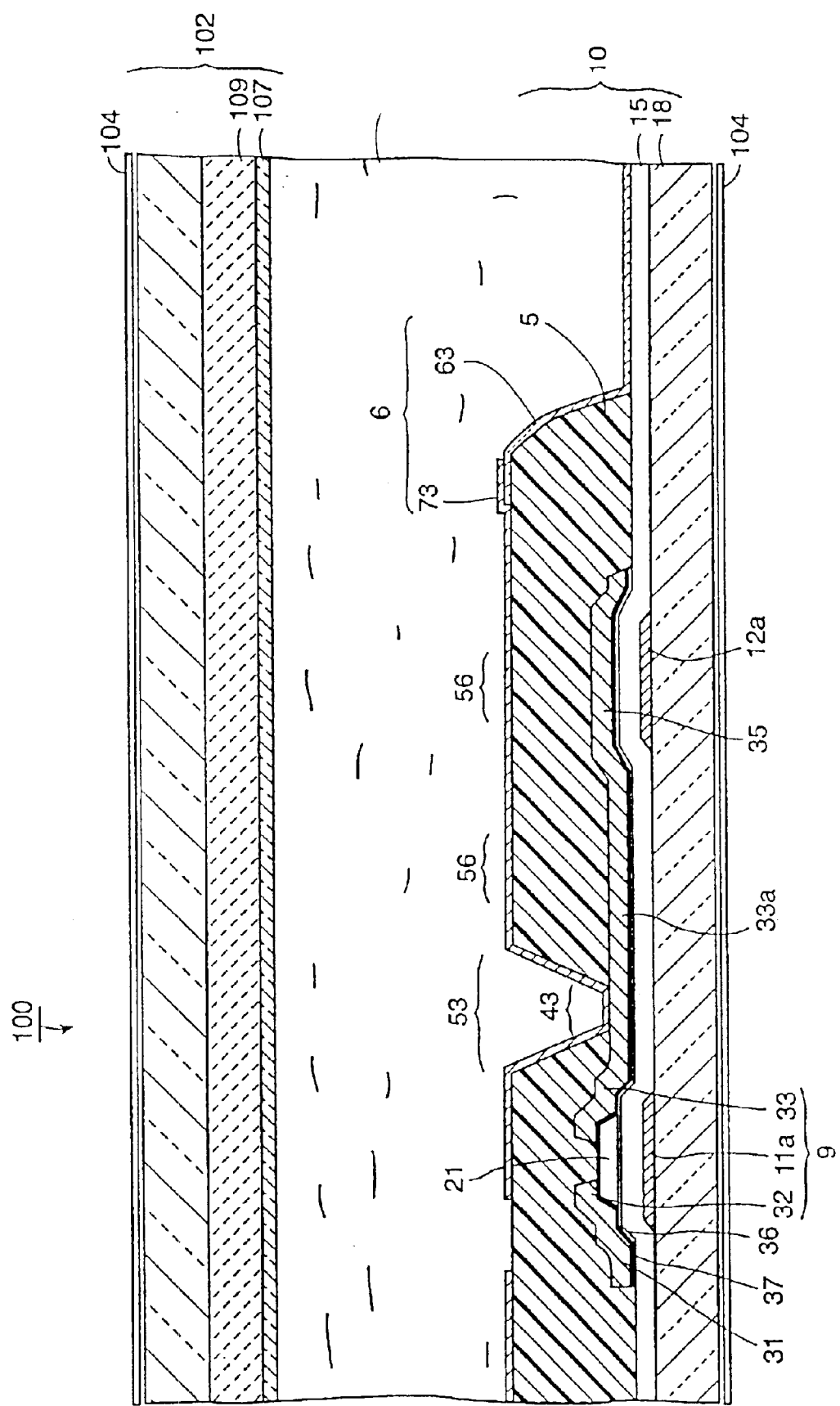
FIG. 29 is a sectional view of a pixel portion of a display panel of the present invention (eleventh embodiment)
Figure 30:
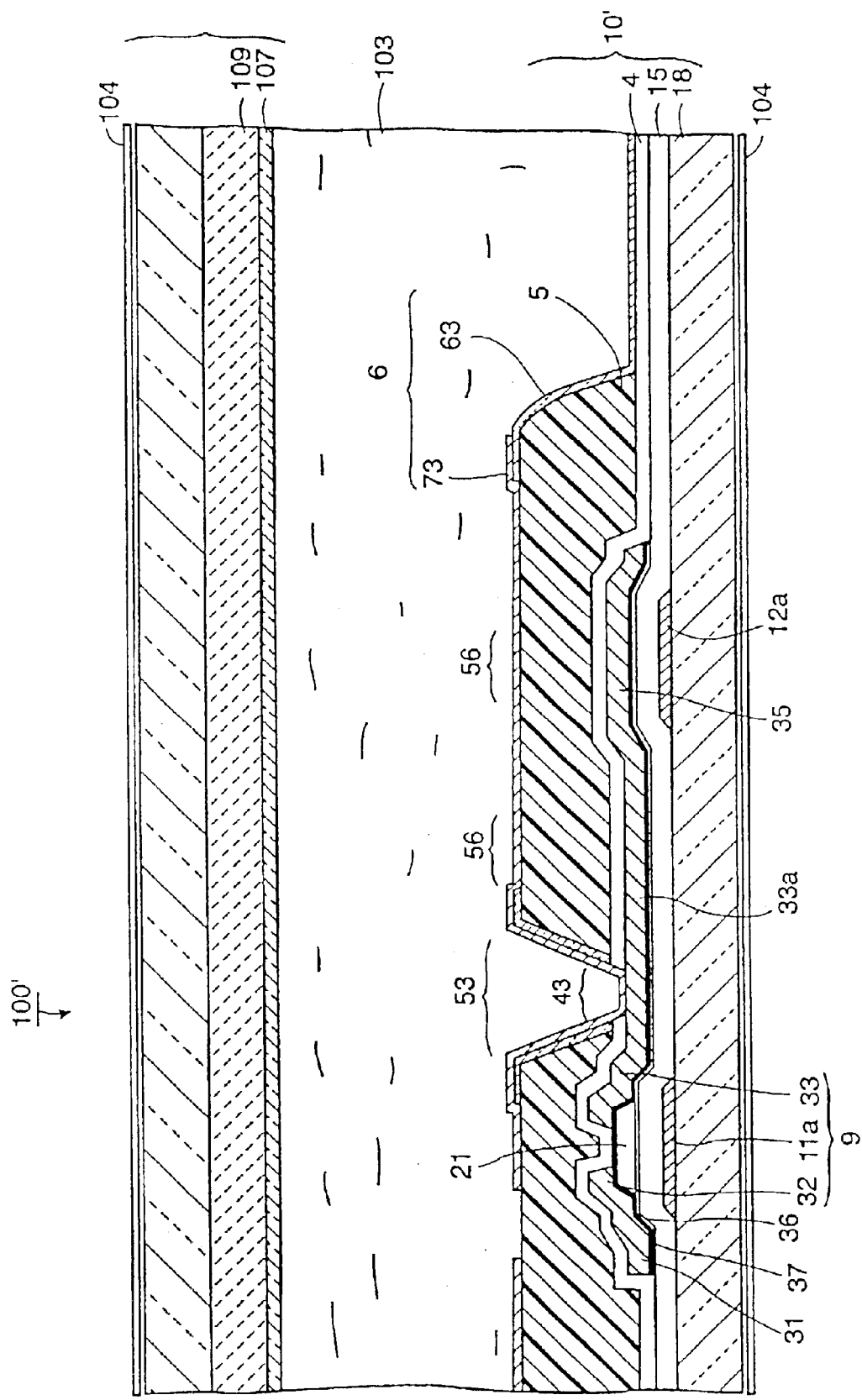
FIG. 30 is a sectional view of a pixel portion of a display panel of the present invention (twelfth embodiment)

Eleventh and Twelveth Embodiments (FIGS. 29 and 30)

Methods of making the TFT array substrate in accordance with seventh and eight embodiments are the same as in the first and second ones except that the concave portions 56 of the thick resin insulation film 5 at the reflection type pixel electrode 73 and the thick resin insulation film 5 at the transparent pixel electrode 63 are omitted, respectively.

FIGS. 29 and 30 show sectional views of the pixel portions of the eleventh and twelfth embodiments corresponding to the first and second ones, respectively. The peripheral portions of the TFT array substrates in the former are exactly the same in structure as in the latter.

Their methods of manufacturing the TFT array substrates are exactly the same as those of the first and second embodiments except that the optically transparent thick resin film 5 is omitted from the portion at the optically transparent pixel electrode 63 and that the concave portions 56 are omitted from the portions at the reflection type pixel electrode 73.

Figure 31:
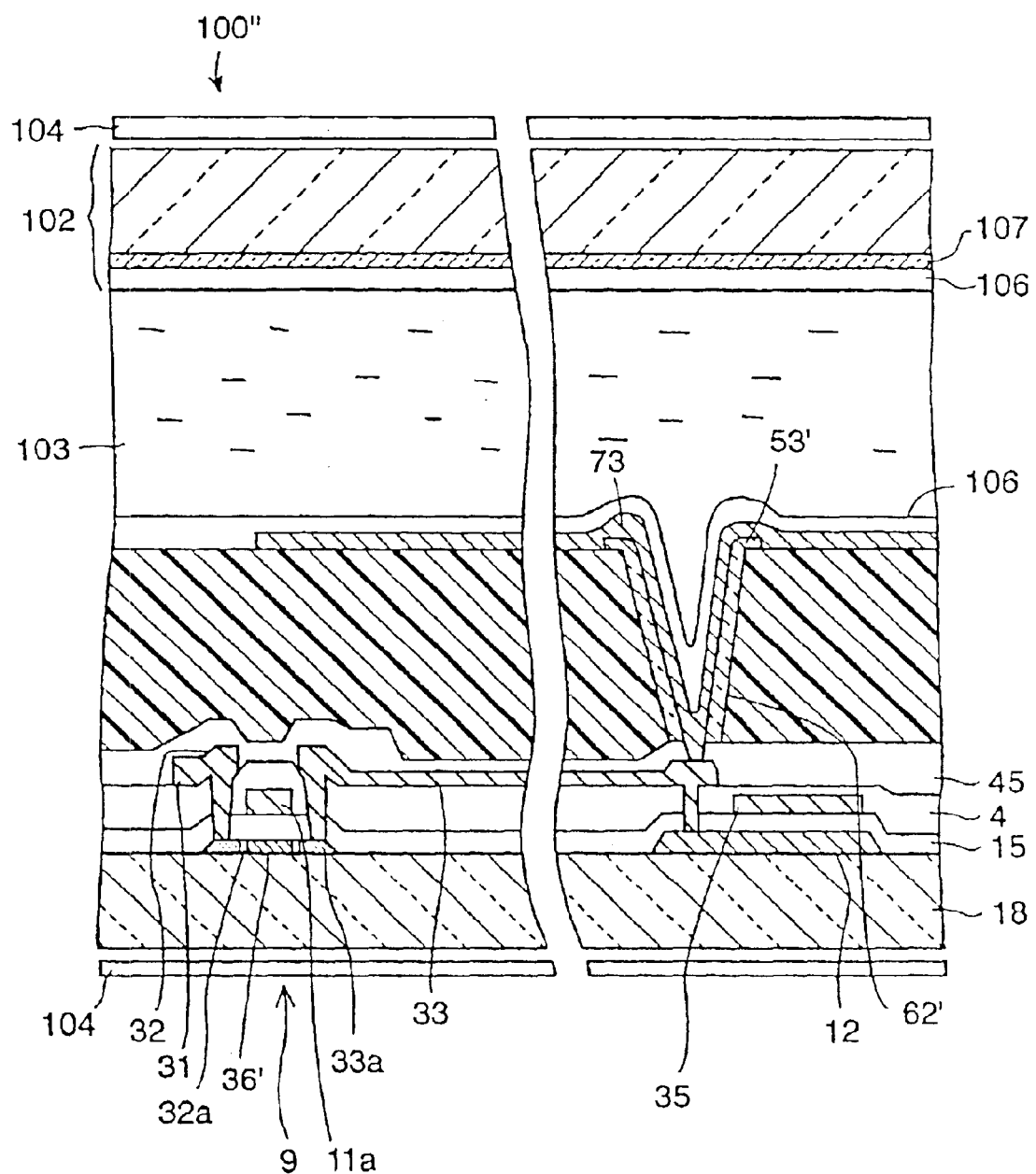
FIG. 31 is a sectional view of a pixel portion of a display panel of the present invention (thirteenth embodiment)
Figure 32:
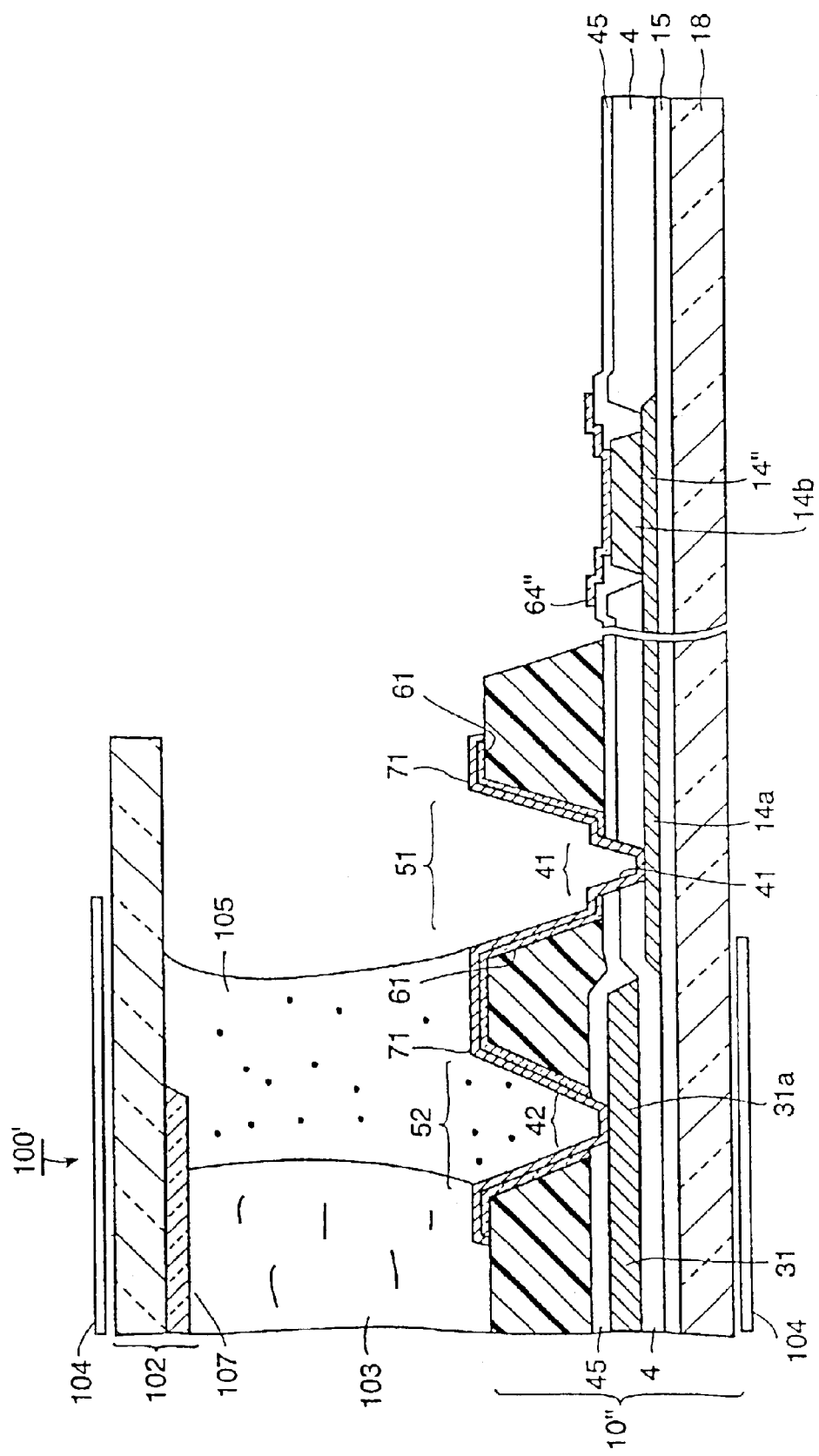
FIG. 32 is a sectional view of a peripheral portion of the display panel of the present invention (thirteenth embodiment)
Figure 33:
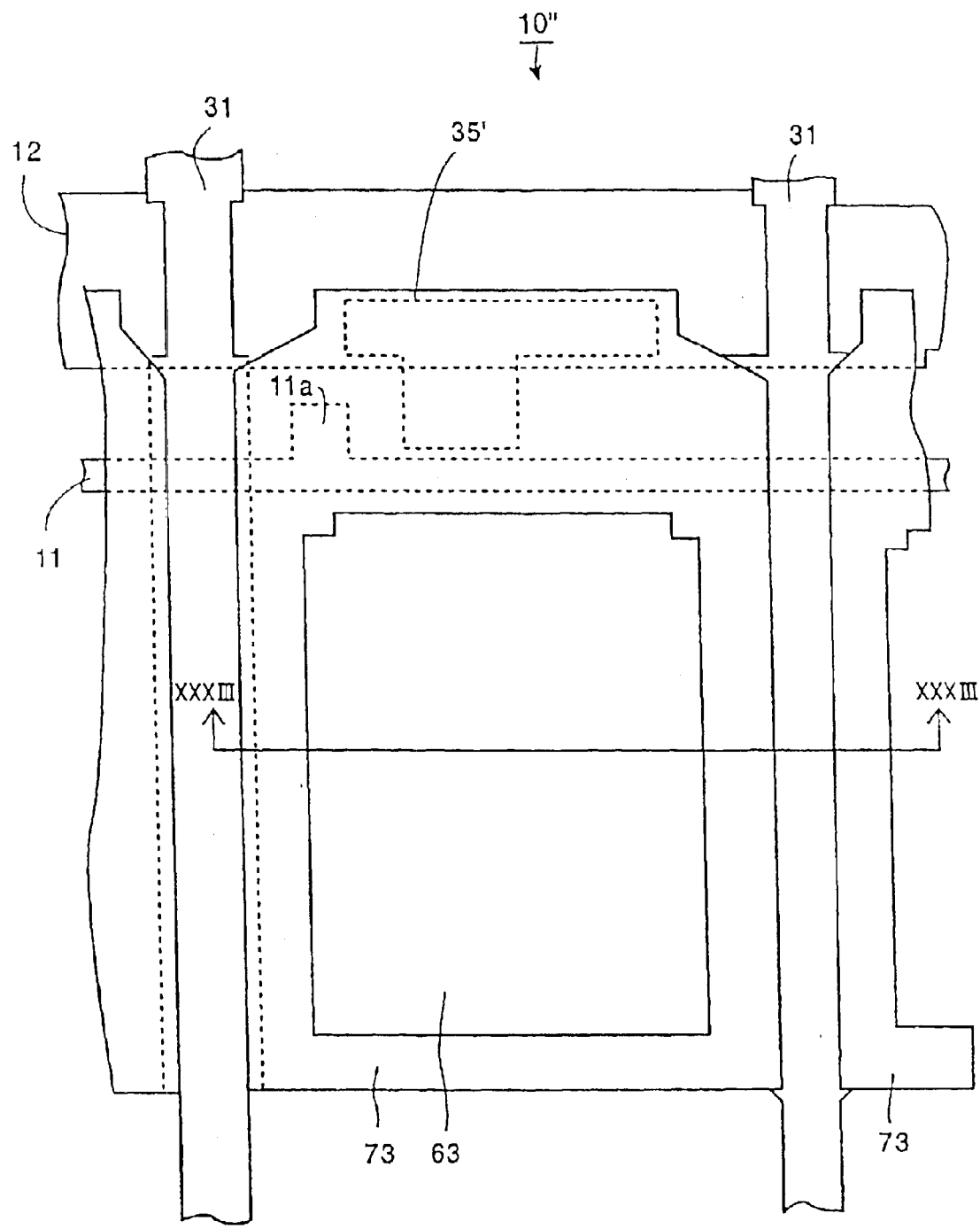
FIG. 33 is a fragmentary plan view of a pixel dot portion of the TFT array substrate of the present invention (thirteenth embodiment)

Thirteenth Embodiment (FIGS. 31, 32 and 33)

With reference to FIGS. 31, 32 and 33, this embodiment will be described below.

This embodiment is directed to the same transflective type normally white mode liquid crystal display device as the first through twelfth embodiments but the thin film transistor is made of polycrystalline silicon.

FIG. 31 shows a sectional view of a display panel 100" at the pixel portion of the TFT array substrate. The thin film transistor 9 is a top gate type and includes a poly crystalline semiconductor layer 36', i.e., the gate electrode 11a is disposed on the top of the semiconductor layer 36' and its contact portions 32A and 33A through a gate insulation film 15.

Color filter layers are made of thick resin insulation films 5 formed on the TFT array substrate 10". Thus, no black matrix is provided on the array substrate 10" or counter substrate 102 but the color filter layers covering the entire portions of the pixel dots, respectively, are formed by applying ink jet dyeing etc. The reflection type pixel electrode 73 is electrically connected to the source electrode through the lower contact hole 43' perforated through a protection film 45 and the upper contact hole 53 perforated through the thick resin insulation film 5. As in the case of the first embodiment, the perforated doughnut-like ITO film 62' is formed on the source electrode 33.

The auxiliary capacitor pattern 35' made at the same time as the semiconductor layer 36 is overlapped, through the gate insulation film 15, with the auxiliary capacitor line 12 (Cs line) made at the same time as the scanning line on the gate insulation film 15. The auxiliary capacitor pattern 35' is electrically connected to the source electrode 33 is electrically connected to the reflection type electrode 73 through the upper contact hole 53' perforating the protection film 45.

FIG. 32 shows a sectional view of the peripheral portion of the display panel 100". As in the embodiments described so far, the end portions 31a made at the same time as the signal lines 31 and the lower connecting line 14a made at the same time as the scanning line 11 are electrically connected to the bridge-like electrically conductive film 71 made at the same time as the reflective type and optically transparent pixel electrodes 73 and 63 through the upper contact holes 51 and 52 perforated through the optically transparent thick resin insulation film 5.

The end portion 31a of the signal line 31 of this embodiment is exactly the same as that of the second embodiment but the interlayer insulation film 4 of the latter is substituted for the protection film 45.

The steps of providing the upper and lower contact holes 51, 52, 53, 53', 41, 42 and 43' are the same as those of the second etching (formation of through holes: 5PEP(2)) in the first or second embodiment. The other steps of making a polycrystalline thin film transistor type TFT array substrate are disclosed in Japanese Patent Disclosures Tokkai 2000-330484 and 2001-339070, for instance.

As shown in FIG. 32, the connecting pad 14" of this embodiment is different in structure from the other embodiments. Since driver integrated circuit boards are formed on the peripheral portion of the TFT array substrate 10", the connecting pad 14" connected to a flexible printed circuit board used for outer driving devices. Thus, the thick resin insulation film 5 is omitted from the surrounding portion of the connecting pad 14". The lower and upper wiring lines 14" and 14b made at the same time as the scanning and signal lines 11 and 31, respectively, are overlapped with each other and are covered by the ITO film 64" made at the same time as the optically transparent pixel electrode 63.

FIG. 33 shows a plan view of the pixel dot in the TFT array substrate 10" of this embodiment. As shown, the reflection type pixel electrode 73 is a window frame pattern, an aperture of which is covered by the optically transparent pixel electrode 63 made of ITO film.

Figure 34:
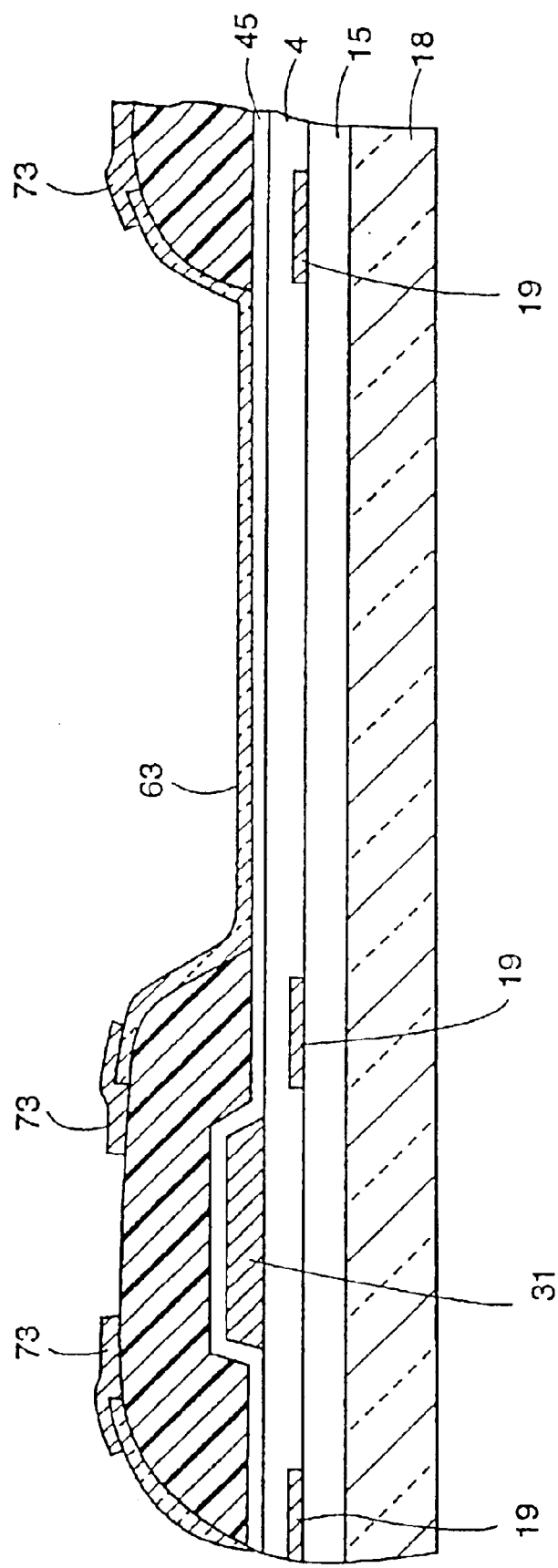
FIG. 34 is a fragmentary plan view of the TFT array substrate of the present invention (thirteenth embodiment).

Fourteenth Embodiment (FIG. 34)

With reference to FIG. 34 a fourteenth embodiment of the invention will be explained below. FIG. 34 shows a sectional view of the signal line 31 at the reflection type and optically transparent pixel electrodes 73 and 63 of the TFT array substrate 10". The optically transparent thick resin insulation film 5 is not provided on the optically transparent pixel electrode 63, so that loss of light passing through it is reduced. The color filters are formed on the counter electrode side and a light shielding film 19 made at the same time as the scanning line 11 is formed at the surrounding portion of the optically transparent electrode 63, i.e., at the slope of the optically transparent thick resin insulation film 5. This structure prevents the light from leaking out from the light shielding film 19 to improve the display function.

Although the reflection type pixel electrode 73 does not include uneven portions on its surface, the optically transparent thick resin insulation film 5 may have such uneven portions to provide the reflection type pixel electrode with light scattering characteristics as in the case of the other embodiments. The steps of assembling the TFT array substrate 10" into the display panel 100" are the same as the first embodiment.

The alignment films 106 made of polyimide are necessarily formed on the facing surfaces of the array and counter substrates as shown in FIG. 31, for example, but they are not shown in FIGS. 3, 4, 13, 14, 25–30 and 32.

The protection film 45 for the base of the optically transparent thick resin insulation film 5 may be omitted. In this case, the structure of the contact holes and the method of making the same are the same as the first embodiment.

In the embodiments, the perforated conductive film (second conductive film) made of transparent electrically conductive film and the bridge-like electrically conductive film (third conductive film) are interchangeable. If interchanged, the first and third etching steps of the fifth patterning are to etch the metal film and the conductive film covering the contact holes is made of a transparent material.

By way of example, the etching stopper type thin film transistor is explained with respect to the first through twelfth embodiments but the channel etching type or even top gate type thin film transistor may be also used for the switching device.

The first wiring pattern (scanning line, etc. pattern) made of a high melting point material, such as molybdenum wolfram (MoW) alloy may be substituted for heaped layers of aluminum and molybdenum. Further, a three-layer film with 15 nm thick bottom Mo, 270 nm thick Al middle and 50 nm thick Mo top layer-structure or a two-layer film with a 270 nm thick Al covered by 50 nm Mo may also used for the first wiring pattern.

The transflactive type liquid crystal display device is explained as a display device for convenience but any display devices including a TFT array substrate with pixel electrodes disposed on thin film transistors and wiring patterns through a thick resin insulation film are applicable as well. The present invention is applicable to an organic electro-luminescence (EL) display device, for example, because the EL display device includes a TFT array substrate with anode and cathode electrodes. In this example, the perforated and bridge-like electrically conductive films are made of the anode and cathode electrodes.

A TFT array substrate for a display device and a method of manufacturing the same of the present invention can improve production efficiency by reducing the number of patterning steps, can also ease production costs and burdens.

Obviously, numerous additional modifications and variations of the present invention are possible in light of the above teachings. It is therefore to be understood that within the scope of the appended claims, the present invention may be practiced otherwise than as specifically described herein.

The present application is based on Japanese Patent Applications 2002-89731 and 2002-89732, filed Mar. 27, 2002, the entire contents of which are hereby incorporated herein by reference.

What is claimed is:

1. An array substrate for a display device comprising:
   a substrate;
   a first electrically conductive film formed over said substrate;
   a first insulation film formed on said first electrically conductive film, said first insulation film having a first contact hole on a place corresponding to said first electrically conductive film;
   a second electrically conductive film;
   a second insulation film having a second contact hole, said second contact hole being covered with said second electrically conductive film to define an aperture; and
   a third electrically conductive film formed on said first insulation film and connected to said first electrically conductive film,
   wherein an upper end portion of said first contact hole of said first insulation film is substantially the same in diameter as said aperture defined in said second contact hole covered with said second electrically conductive film.

2. The array substrate for a display device according to claim 1, wherein said second insulation film is made of equal to or more than 1 μm in thickness resin.

3. The array substrate for a display device according to claim 1, further comprising pixel electrodes in matrix made of at least the same one of either said second and third electrically conductive films.

4. The array substrate for a display device according to claim 3, wherein said pixel electrodes are made of said second and third electrically conductive films, one of said second and third electrically conductive films being optically transparent and the other being optically reflective.

5. The array substrate for a display device according to claim 4, wherein said array substrate is used for a half transparent type liquid crystal display device.

6. The array substrate for a display device according to claim 4, wherein said second insulation film is provided at a place corresponding to said pixel electrode made of said optically reflective and electrically conductive film.

7. The array substrate for a display device according to claim 4, wherein said second insulation film includes an aperture at a place corresponding to said pixel electrode made of said optically transparent and electrically conductive film.

8. The array substrate for a display device according to claim 1, wherein said array substrate is used for an organic electro-luminescence display device.

9. The array substrate for a display device according to claim 8, wherein said second and third electrically conductive films are made of the same materials as anode and cathode electrodes of said organic electro-luminescence display device.

10. A method of making an array substrate for a display device, comprising the steps of:
   making a first electrically conductive film on an insulation substrate;
   forming a first insulation film to cover said first electrically conductive pattern;
   forming a second insulation film on said first insulation film with a contact hole at a place corresponding to said first electrically conductive film;
   making second electrically conductive film on said second insulation film;
   first patterning of said second electrically conductive film by using a pattern photomask with an aperture made smaller in diameter than said contact hole;
   second patterning to expose said first electrically conductive film wherein etching of said first insulation film is carried out by using said photomask and through said aperture of said second electrically conductive film to make a contact hole larger in diameter than said aperture of said second electrically conductive film;
   third patterning of said second electrically conductive film by using said contact hole of said first insulation film; and
   removing said pattern photomask and forming third electrically conductive film connected to said first electrically conductive film through said contact holes of said first and second insulation films.

11. The method of making an array substrate for a display device according to claim 10, further comprising the steps of:

making a third insulation film between said first and second insulation films, wherein said third insulation film is subjected to said etching step of said first insulation film.

12. The method of making an array substrate for a display device according to claim 11, wherein said second patterning step carries out side etching of said third insulation film at a speed faster that that of said first insulation film.

13. The method of making an array substrate for a display device according to claim 11, wherein said first insulation film is made of upper and lower insulation films and second patterning step carries out side etching of said upper insulation film at a speed faster that that of said lower insulation film.

14. The method of making an array substrate for a display device according to claim 13, wherein said second etching step carries out wet etching.

15. The method of making an array substrate for a display device according to claim 14, wherein said wet etching uses etching solution of buffered hydrofluoric acid.

16. The method of making an array substrate for a display device according to claim 13, wherein said second etching carries out dry etching.

* * * * *